US009035344B2

(12) United States Patent
Jain

(10) Patent No.: US 9,035,344 B2
(45) Date of Patent: May 19, 2015

(54) PHOSPHORS FOR USE WITH LEDS AND OTHER OPTOELECTRONIC DEVICES

(75) Inventor: Ajaykumar R. Jain, San Carlos, CA (US)

(73) Assignee: VerLASE Technologies LLC, Winooski, VT (US)

(*) Notice: Subject to any disclaimer, the term of this patent is extended or adjusted under 35 U.S.C. 154(b) by 0 days.

(21) Appl. No.: 14/241,564

(22) PCT Filed: Sep. 11, 2012

(86) PCT No.: PCT/US2012/054638
§ 371 (c)(1),
(2), (4) Date: Feb. 27, 2014

(87) PCT Pub. No.: WO2013/039879
PCT Pub. Date: Mar. 21, 2013

(65) Prior Publication Data
US 2014/0367719 A1    Dec. 18, 2014

Related U.S. Application Data

(60) Provisional application No. 61/573,873, filed on Sep. 14, 2011, provisional application No. 61/629,098, filed on Nov. 14, 2011.

(51) Int. Cl.
*H01L 33/50*    (2010.01)
*C09K 11/88*    (2006.01)
*H05B 33/10*    (2006.01)
*H05B 33/14*    (2006.01)

(52) U.S. Cl.
CPC .............. *H01L 33/502* (2013.01); *C09K 11/88* (2013.01); *H05B 33/10* (2013.01); *H05B 33/14* (2013.01); *H01L 2933/0041* (2013.01); *H01L 2924/0002* (2013.01)

(58) Field of Classification Search
CPC ... H01L 33/502; H01L 33/504; H01L 33/505; H01L 33/507; H01L 33/508; H05B 33/14
USPC .......... 257/13, 78, 88, 98, 99, E27.12, E33.06
See application file for complete search history.

(56) References Cited

U.S. PATENT DOCUMENTS

2002/0093282 A1* 7/2002 Kumada et al. ............... 313/483
2008/0283864 A1   11/2008 Letoquin et al.
(Continued)

FOREIGN PATENT DOCUMENTS

JP    2005294646 A    10/2005
JP    2011077551 A    4/2011

OTHER PUBLICATIONS

International Search Report and Written Opinion dated Feb. 26, 2013 in connection with related PCT/US2012/054638.

*Primary Examiner* — Selim Ahmed
(74) *Attorney, Agent, or Firm* — Downs Rachlin Martin PLLC

(57) ABSTRACT

Phosphors fabricated from one or more layers of a naturally lamellar or fabricated lamellar semiconductor that is combined with a substrate. One or more of the layers of the lamellar semiconductor are separated from bulk material. The one or more layers are transformed into a phosphor for use with one or more light-emitting devices for the purpose of modifying the light emitted by the light-emitting device(s). Such transformation can be effected in a variety of ways, such as precise thinning or thickening of the removed layer(s) and/or intercalating one or more species of ions into the layer(s) that function as phosphors.

66 Claims, 16 Drawing Sheets

(56) References Cited

U.S. PATENT DOCUMENTS

| | | |
|---|---|---|
| 2009/0014744 A1 | 1/2009 | Hsieh et al. |
| 2009/0322197 A1* | 12/2009 | Helbing .................. 313/46 |
| 2010/0051984 A1 | 3/2010 | West |
| 2010/0295057 A1 | 11/2010 | Sun et al. |
| 2011/0156575 A1* | 6/2011 | Yu et al. .................. 313/503 |
| 2011/0266569 A1* | 11/2011 | Basin et al. .................. 257/98 |

* cited by examiner

Bandgap versus thickness of the thin films

Quantum well thickness in Angstrom (A)

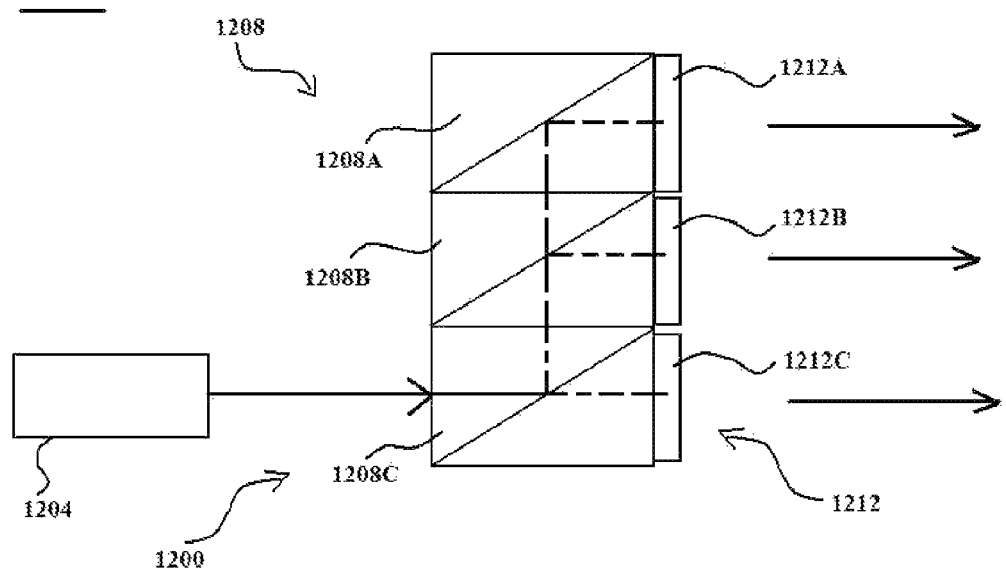
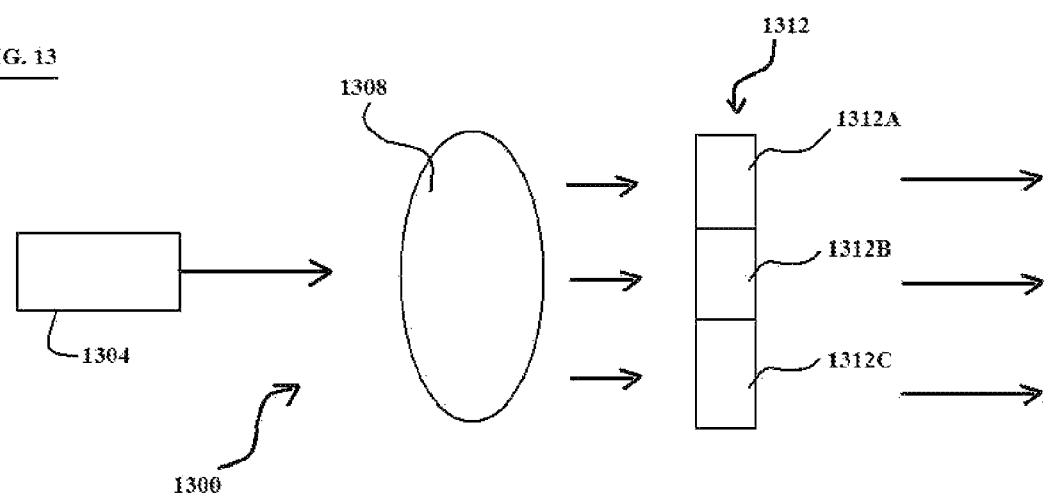

US 9,035,344 B2

PHOSPHORS FOR USE WITH LEDS AND OTHER OPTOELECTRONIC DEVICES

RELATED APPLICATION DATA

This application claims the benefit of priority of U.S. Provisional Patent Application Ser. No. 61/573,873, filed Sep. 14, 2011, and titled "Novel Materials for Use as Phosphors in Making LEDs and other Opto-electronic Devices" and U.S. Provisional Patent Application Ser. No. 61/629,098, filed Nov. 14, 2011, and titled "Novel Materials for Use as Phosphors in Making LEDs and other Opto-electronics Devices", each of which are incorporated by reference herein in its entirety.

FIELD OF THE INVENTION

The present invention generally relates to the field of wavelength converters for optoelectronic devices. In particular, the present invention is directed to phosphors for use with LEDs and other optoelectronic devices, and methods of making the same.

BACKGROUND

In general, a phosphor is a material that exhibits luminescence, which is generally the generation of light in excess of that which is radiated thermally. Luminescence is the result of the competition of radiative and non-radiative pathways in the relaxation of an electronically excited species. Luminescence encompasses many different excitation pathways, such as, but not limited to, excitation caused by electrons (cathodoluminescence), excitation caused by light (photoluminescence), excitation caused by X rays or particles (scintillation), and excitation by electrons and holes (electroluminescence). Furthermore, depending on the relaxation time, scale is broken down into scintillation, spontaneous emission, fluorescence, phosphorescence, etc.

Many phosphors belong to the lanthanide group, also termed the rare earth elements. If one succeeds in introducing these rare earth ions (also called dopants and/or activators) into a particular host material, be it a crystal, a glass, a liquid, a molecular material such as a polymer, the host material may become luminescent. Practically speaking, however, a luminescent material must be easily excited by the appropriate excitation, have a high quantum efficiency, i.e., the ratio of the number of quanta absorbed to the number emitted, convert the energy absorbed to a useful frequency of visible light (if the use is in the visible), and maintain its usefulness under both excitation mode and ambient usage conditions, and, ideally, is easily manufactured.

Commercial prior art phosphors are mostly inorganic compounds prepared as powders (with grain sizes usually in the order of 2-20 μm) or thin films. The phosphor materials contain one or more impurity ions or activators, typically present in 0.01-100 mol % concentrations, with the actual light emission generated by these activator ions.

SUMMARY OF THE DISCLOSURE

In one implementation, the present disclosure is directed to a phosphor for use with an optoelectronic device. The phosphor includes one or more layers separated from a bulk material, the bulk material being configured to be cleavable into a plurality of the one or more lamellae, and wherein the one or more lamellae are tuned to the optoelectronic device so as to provide a photoluminescence output.

In another implementation, the present disclosure is directed to a method of producing a phosphor for modifying an electromagnetic input. The method includes providing a bulk lamellar semiconductor having a first surface; bonding a permanent substrate to the first surface of the bulk lamellar semiconductor; inducing a cleavage in the bulk lamellar semiconductor so as to generate a first cleaved semiconductor portion and a second cleaved semiconductor portion; and detaching the permanent substrate and the first cleaved semiconductor portion from the second cleaved semiconductor portion, wherein the first cleaved semiconductor portion is a lamellae of the phosphor and wherein the lamellae is designed and configured to modify the electromagnetic input.

In still another implementation, the present disclosure is directed to a method of fabricating a phosphor. The method includes providing a lamellar semiconductor having at least one detachable lamella; separating the detachable lamella; and including the detachable lamella with an optoelectronic device as an optical functional element of the optoelectronic device.

In yet another implementation, the present disclosure is directed to a method of fabricating an optoelectronic device including an optically functional element. The method includes providing a lamellar semiconductor having a crystalline semiconductor lamella, wherein the lamellar semiconductor is configured to allow the crystalline semiconductor lamella to be separated therefrom; separating the crystalline semiconductor lamella from the lamellar semiconductor; including the crystalline semiconductor lamella with the optoelectronic device as the optically functional element; and providing the optically functional element with a predetermined thickness based on the optical function of the optoelectrically functional element.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 12 is a schematic diagram of an exemplary device using multiple phosphors according to an embodiment of the present invention;

FIG. 13 is a schematic diagram of another exemplary device using multiple phosphors according to an embodiment of the present invention;

DETAILED DESCRIPTION

According to certain embodiments of the present disclosure, phosphors are fabricated from one or more layers of a lamellar semiconductor that are designed and configured to modify (e.g., downconvert or upconvert) light emitted by optoelectronic devices. Naturally lamellar semiconductors are semiconductor materials with a basic unique property of being made up of layers of cations that are separated by layers of anions bound by van der Waals (vdW) forces only. This construction allows lamellar semiconductor materials to exhibit anisotropic physical, chemical, and electrical behavior both in-plane and out-of-plane, and allows for the ability to "cleave" a layer from the lamellar material—a layer that can be attached to a permanent substrate and used as a phosphor. In addition to naturally lamellar semiconductors, lamellar semiconductors suitable for use as phosphors of the present invention can be made in any of a variety of ways, including, but not limited to, intercalation, implantation, etc. to create planes of weakness, and forming semiconductor paper, coatings, and other forms of artificially lamellar semiconductor-based materials.

Figure 1:
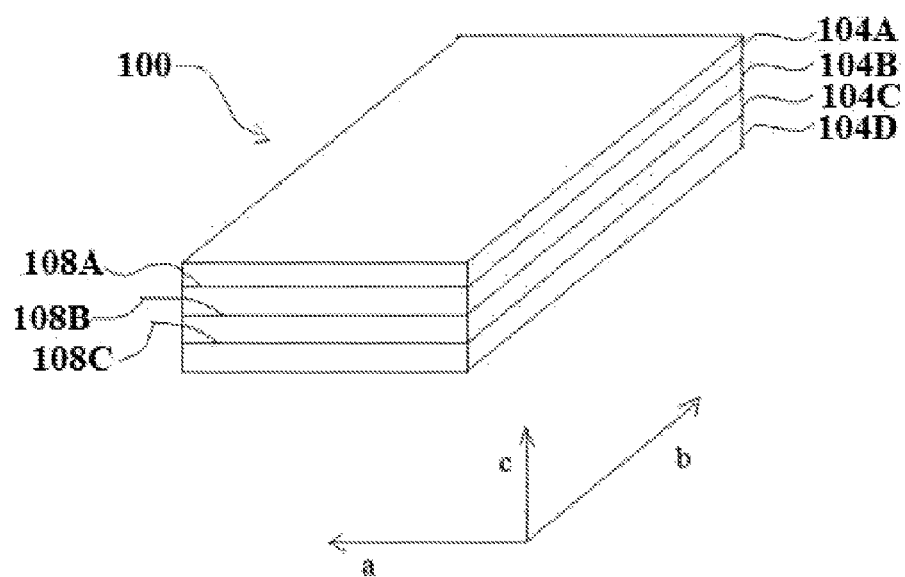
FIG. 1 is a schematic diagram illustrating the structure of a lamellar semiconductor according to an embodiment of the present invention.

An example of a lamellar semiconductor 100 is shown in FIG. 1. Lamellar semiconductor 100 includes four lamellae 104A-104D and three cleavage planes 108A-108C; however, those skilled in the art will readily understand that the semiconductor selected can have fewer or (typically many) more than four lamellae and three cleavage planes. Lamellar semiconductor 100 can be any of a wide variety of materials, including those that are naturally lamellar, as well as those that require processing to adopt a lamellar-like layered structure. When properly constructed, as discussed further below, one or more layers separated from lamellar semiconductor 100 act as a phosphor.

As suggested above, lamellae 104A-104D can be separated by cleaving. As typically understood, cleaving is the process of separating a material along its natural crystal planes. Separation along natural planes creates the cleanest edge possible due to the regularity of the material's atomic structure. Cleaved surfaces produce smooth mirrored surfaces that effectively reflect light. Cleavage fracture is the simplest fracture mechanism, because all that is involved is breaking bonds between atoms. Cleaving can be achieved by making a small notch in the edge of a wafer, and then applying tensile strain to the notch. This small notch creates a stress concentration that drives crack propagation. If aligned properly, the crack will propagate along crystal planes—the path of least resistance. Once a cleavage crack is nucleated, it grows by simply "unzipping" the crystal by sequentially breaking the bonds between two adjacent planes of atoms. Cleavage fracture occurs preferentially along certain atomic planes. Therefore cleavage fracture surfaces are very flat within one crystal. In some crystals, only one or two families of planes are prone to cleaving, whereas others exhibit many cleavage fracture planes. Since cleavage fracture involves no processes other than bond breaking, all of the energy required for fracture should be consumed by the bond breaking process. Breaking the bonds along a plane of atoms is energetically cheap, costing about 2 $J/m^2$ to 4 $J/m^2$ for most types of materials.

Figure 2:
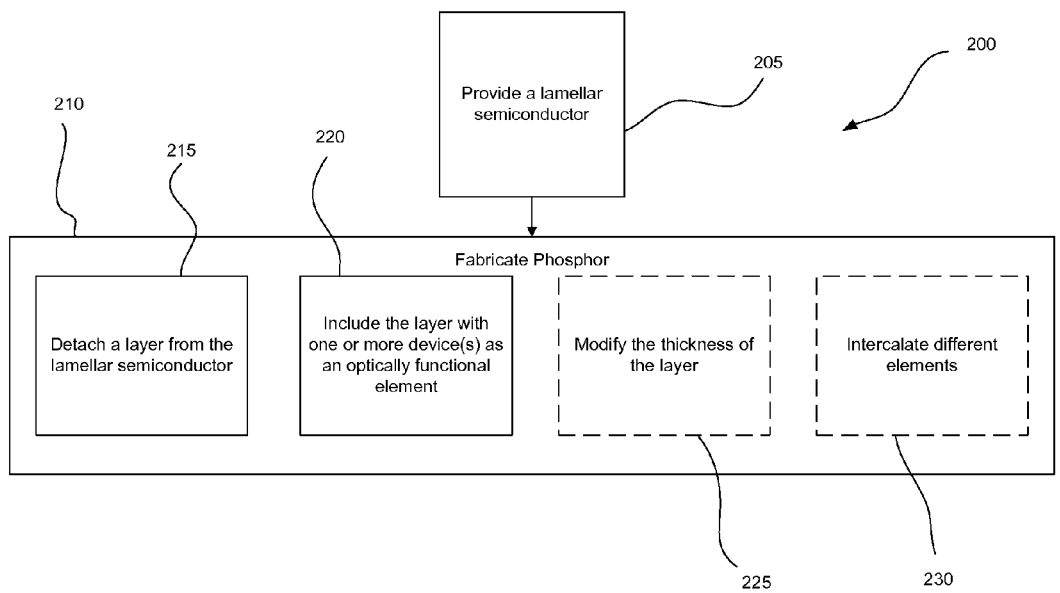
FIG. 2 is a block diagram of a method of fabricating a phosphor according to an embodiment of the present invention.
Figure 3A:
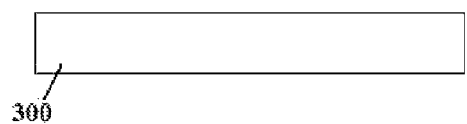
FIGS. 3A-D are schematic diagrams illustrating the separation of a layer of a lamellar semiconductor from a bulk lamellar semiconductor according to an embodiment of the present invention.
Figure 3B:
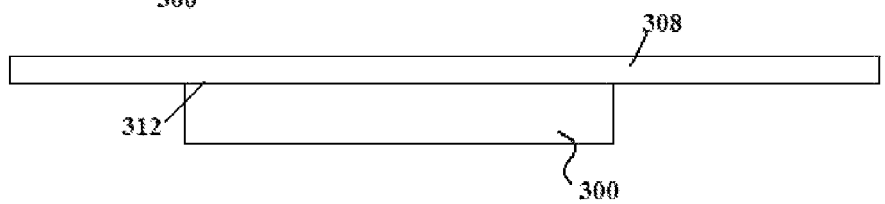
Figure 3C:
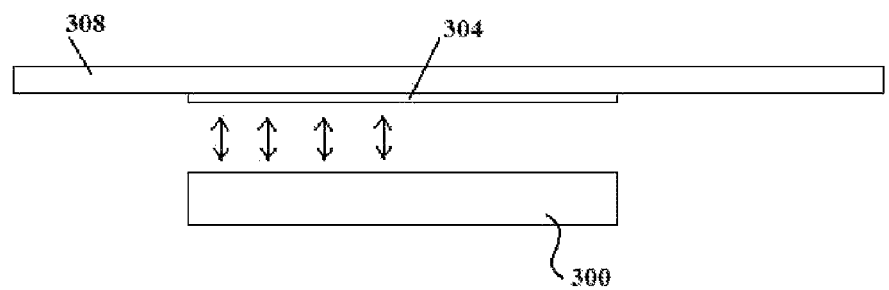
Figure 3D:
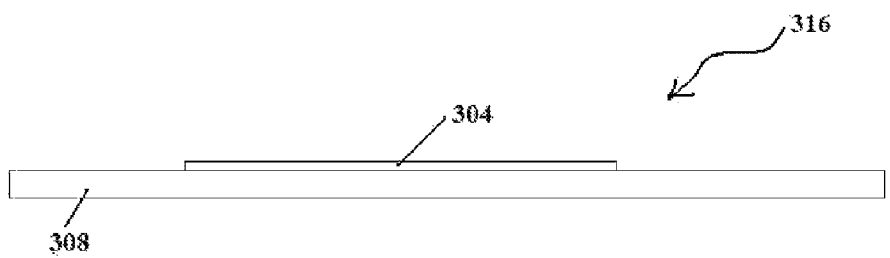

Referring now to FIG. 2, there is illustrated an exemplary method 200 of fabricating and using one or more phosphors by detaching a semiconductor layer from a lamellar semiconductor (also referred to as a "bulk material"). The resulting layer can then be used as an optically functional element so as to alter the light output of an optoelectronic device. By "optically functional element" it is meant that when the layer receives a light input of a certain wavelength from an optoelectronic device, such as a light-emitting diode (LED) or laser diode (LD), among others, the layer converts at least some of the incoming light to a different wavelength. Optically functional elements are different from "electrically functional elements" in that the latter refers to an electrical or optoelectrical circuit element that provides a basic electrical or optoelectrical function when subjected to electrical stimulation, whereas the former does not require any electrical stimulation to alter the output light wavelengths of the optoelectronic device.

At a high level, method 200 begins at step 205 by the providing of a lamellar semiconductor chosen primarily for its photoluminescence characteristics, in conjunction with the selection of the input excitation device(s) (e.g., LED(s), LD(s), etc.), the desired output of the phosphor when the finished device is operating, and any quantum-confinement effects that will be utilized in the final design of the phosphor layer(s). Other factors that may further guide the choice of the lamellar semiconductor include physical characteristics such as lattice constants, lamellae thickness, and chemical composition. However, the foregoing factors need not be rigidly applied. Further factors that may affect the choice of a lamellar semiconductor include the ability to fabricate the lamellar semiconductor into a quantum confinement layer, deposit the lamellar semiconductor epitaxially, reduce the number and density of dislocations or grain boundaries present, and other factors well known to those skilled in the art. These additional criteria, and others known to those skilled in the art, may be used to choose the lamellar semiconductor.

As will become apparent from reading this entire disclosure, the selected lamellar semiconductor can have any one of a number of morphologies. For example, a lamellar semiconductor can be a single crystal, polycrystalline, micro-crystalline, nano-crystalline, textured, or amorphous, among other morphologies not expressly disclosed.

After selecting the lamellar semiconductor at step 205, method 200 proceeds to meta-step 210 in which one or more phosphors are created. In this embodiment, meta-step 210 includes step 215 of detaching a layer from the selected lamellar semiconductor, step 220 of including the detached layer with one or more light-emitting devices for downconverting or otherwise altering the output light of the light emitting device(s), optional step 225 of modifying the thickness of the detached layer, and optional step 230 of intercalating the lamellar semiconductor with other elements. It is noted that steps 215, 220, 225, and 230 are not shown in any particular order. As will become apparent after reading this entire disclosure, this is so because steps 215, 220, 225, and 230 are performed in differing orders depending on the particular materials and techniques used. Steps 215, 220, 225, and 230 are generally described immediately below and are then exemplified in several specific examples.

One possible starting point within meta-step 210 is step 215. At step 215, at least one layer is detached from the lamellar semiconductor. Depending on the starting dimensions of the lamellar semiconductor, the dimensions of a first layer detached therefrom, and the amount of the lamellar semiconductor remaining after detaching the first layer, it is possible that at least one more layer can optionally be detached from the lamellar semiconductor by repeating step 215. Detaching the layer from the lamellar semiconductor in this step can be accomplished using any one of a number of techniques. For example, the layer can be detached from the lamellar semiconductor by cleaving, as discussed above. Alternative separation techniques and examples of cleaving, crack initiation, and crack propagation techniques are described in related U.S. Provisional Applications Nos. 61/573,873 and 61/629,098 noted in the Related Application Data section, above, and incorporated herein by reference for all of their teachings relative to separation techniques.

As another example of detaching one or more layers from the lamellar semiconductor, the lamellar semiconductor could be intercalated with suitable ions. Intercalation refers to the process of introduction of guest species in between the layers of the layered semiconductor materials. The guest species is called an "intercalant." The intercalant is flanked by a semiconductor layer on either side and is typically immobilized and shielded. The physical, chemical, and electrical properties of the intercalated material (interlamellar compound) can be markedly different than the un-intercalated layered semiconductor in spite of the fact that the inter-layer distance might not be significantly affected during the intercalation process. Post such intercalation, an impulse in the form of rapid heating, vacuum, pressure, etc., could be applied to cause the individual sheets making up the lamellar semiconductor to exfoliate/expand and separate into one or more layers.

Compounds that can be used as intercalants can be organic or inorganic in composition. For example, possible intercalants may include one or more of the following: halogens (e.g., F, Cl, Br, I), alkali metals (e.g., Li, Na, K, Rb, Cs), alkaline earth metals (e.g., Be, Mg, Ca, Sr, Ba); Hg-alkali containing compounds; hydrogen-alkali containing compounds; lanthanides (e.g., Eu, Yb, Sm, Tm); aluminum chloride; ferric chloride; metal halides; arsenic sulfide; thallium sulfide; water; sulfates (sulfuric acid and other strong oxidants and reductands); nitrate; various organic acids; sodium-benzene; ammonia; n-butyl lithium in hexane; tetrahydrofuran; aromatic compounds; quarternary ammonium ions like cetyl-trialkyl-ammonium or cetyl-vinyl-dialkyl-ammonium; 1-pyrenecarboxylic acid (PCA); macromolecules like dyes, monomers, and polymers. One or more of these intercalation compound(s) may be used together, if so desired.

The intercalation compound(s) may be introduced into the layered semiconductor layers by traditional chemical/solution approaches, chemical reactions, ion exchange, ion beam implantation, or by other methods known to skilled artisans. The intercalation compound(s) may intercalate into the lamellar semiconductor material layers completely or only partially. The intercalation time may be from a few seconds to weeks to months as required. Intercalation may be performed under various conditions such as, but not limited to, a vacuum, a high pressure, a high temperature, with agitation, and ultrasonic. The ratio of intercalant versus lamellar semiconductor may be 1:1 or any other ratio as desired to achieve the level of intercalation.

The individual layers that exfoliate through the process of intercalation can then be deposited onto a suitable permanent substrate of choice using a suitable deposition technique. Deposition techniques may include, but not limited to, spin coating process, spray coating process, ink jet processes, powder jet processes, roll on coating processes, printing processes, transfer processes, dip coating, Langmuir-Blodgett process or its variants such as, but not limited to, Schneider-Picard (SP) process, dynamic surface tension process (DST), wet electro static transfer, dry electro static transfer, slot die extrusion, electro plating (liquid electrolyte), electro spraying or electro static coating (air electrolyte), electro wetting, plasma thermal spray, electro spray, slot die coating, and charged photo conductive drum (xerography).

Before proceeding beyond the discussion of step 215, some advantages of cleaving are presented. One advantage of cleaving, for example, is that when performed with sufficient precision, it can produce a detached layer that is only a few lamellae thick, which may range from 1 micron down to 10's of nanometers. A layer having sufficiently few lamellae, and therefore being sufficiently thin, can allow for precision in tuning the phosphor to ideally change the incoming light wavelength to a desired wavelength. Furthermore, because cleaving can detach the layer along a natural cleavage plane, the cleavage surfaces, being substantially coincident with the atomic planes forming the surfaces of the lamellae, can be extremely smooth.

Step 215 can alternatively be accomplished by methods other than directly cleaving the lamellar semiconductor. In one exemplary embodiment of step 215 (and as described in more detail in method 600 below), the lamellar semiconductor can be attached to a substrate, which can facilitate cleavage or other separation techniques by assisting in the separation of a layer of a desired thickness from the lamellar semiconductor. Optionally, this peeling can be facilitated by first introducing a crack in the lamellar semiconductor, as described above, so as to initiate the crack at an approximate predetermined location and produce a layer of an approximately predetermined thickness. In addition to the cleaving and peeling techniques described above, step 215 can also be accomplished using other techniques including, but not limited to, sawing, laser scribing, pressurized fluid cutting, thermally induced stress fracturing, microtome, ultramicrotome, ultratome, exfoliation by vacuum or intercalation, and other techniques known to those skilled in the art.

At step 220, another step within meta-step 210, the detached layer/phosphor is included with one or more optoelectronic devices as an optically functional element. As but one example, and as shown in FIG. 12 and discussed in detail below, one or more phosphors are coupled to a beam splitter and used to downconverter the light received from a light source. Fundamentally, there is no limitation on the type of device(s) with which the layer can be used. For example, the detached layer can be used with one or more LEDs, one or more LDs, or any of many other optoelectronic devices. A small selection of some of these exemplary devices are presented in the present disclosure, although the teachings disclosed herein can be applied to other devices not expressly presented.

Step 225 involves providing the detached layer with a predetermined thickness as needed for the desired functionality of the optoelectronic device. At step 225, the thickness of the layer can be modified by adding or removing material, thereby providing the layer with an approximate predetermined thickness selected to meet one or more physical and/or optoelectrical design criteria. This approximate predetermined thickness can be achieved using the techniques described below, as well as others not expressly mentioned but well known in the art. Before discussing some exemplary techniques in detail, it is noted that these techniques generally fall into two broad categories: techniques used to increase the thickness of, i.e., thicken, the layer and techniques used to decrease the thickness of, i.e., thin, the layer.

If the detached layer is too thin to meet the desired design thickness, then its thickness can be increased by adding material using a number of well known techniques. These techniques include, but are not limited to, chemical vapor deposition, sputtering, or other techniques used for crystalline or amorphous material growth. As another example, the thickness can be modified using an intercalant. Rather than acting as an exfoliating mechanism as described above, in this instance, the intercalant can act to physically alter the inter-lamellar gallery dimension by swelling the inter-lamellar spacing upon entry. In addition, the intercalant can be electronically active thereby modifying the band gap of the layer hosting the intercalant. Other means of adding material to a layer are well known to the skilled artisan and need not be further recited in the present disclosure.

The decision of which technique should be used to add material can include considerations as to whether the additional material will be deposited homo-epitaxially or hetero-epitaxially. While this additional factor can be used, skilled artisans will appreciate that many other factors can also be used to decide the deposition technique without departing from the teachings of the present disclosure.

If the detached layer at step 225 is too thick to meet the desired thickness, exemplary techniques of material removal include, but are not limited to, repeating the separation method previously used in the process at step 215, e.g., cleaving along an inherent cleavage plane or other plane of weakness, or using processes such as wet chemical etching, reactive ion etching, or plasma etching. Alternatively, using the intercalation technique presented above, an intercalant may be used to further weaken inter-lamellar bonding, thereby facilitating layer separation, either alone or in combination with another technique. These, and other material removal techniques well known in the art, can be applied to achieve the desired thickness of the optically functional element without departing from the teachings of the present disclosure.

As a further optional step, at step 230, rare earth elements, such as, but not limited to, La, $La^{3+}$, $Tb^{3+}$, $Yb^{3+}$, $Eu^{2+}$, $Eu^{3+}$, Ce, $Ce^{3+}$, $Dy^{3+}$, Gd, $Nd^{3+}$, $Lu^{3+}$, and $Er^{3+}$, may be intercalated into the layers, whether they be the lamellar semiconductor layer, lamellar insulating layer, or lamellar conductor layer (discussed in more detail below). These elements may be used as phosphors to alter the wavelength or frequency change capable by the phosphor. Ion implantation or ion exchange may alternatively be used to introduce these rare earth elements and their ions into the lamellar materials described herein.

One feature related to the thickness of the detached layer, and applicable to all steps of meta-step 210, is the ability to increase a band gap of a layer over the inherent band gap of the material forming the layer by thinning a layer to less than 100 nm, and preferably less than approximately 30 nm, and further preferably less than approximately 10 nm. Therefore, regardless of the method used, steps 215, 220, 225, and 230 can be used, alone or in combination, to tune the band gap of the layer to further meet the desired wavelength output of the phosphor.

The foregoing presentation of steps 215, 220, 225, and 230 is not meant to imply a particular order to those steps. For example, a layer could be detached from a lamellar semiconductor at step 215, its thickness modified at step 225, and placed into use with a device at step 220. In another example, step 225 of providing a predetermined thickness could be performed first, followed by step 220 and then by step 215. In addition, it is noted that ones of steps 215, 220, 225 can be performed simultaneously with one another. For example, if step 215 of liberating the layer from the lamellar semiconductor results in the thickness of the layer being its desired value, then step 225 of providing a predetermined thickness is essentially subsumed in the liberating step. As can be appreciated, still other orders of meta-step 210 are possible without departing from the teachings of the present disclosure.

At any point within, or after, meta-step 210 and at any point in relationship to steps 215, 220, 225 and 230, it may be desirable to measure the thickness of the layer before, during, or after adjustment. The thickness of the layer can be measured by mechanical means, such as graduated caliper or micrometer, or by other means. These means include optical ellipsometry, other optical techniques, sonic techniques, and other direct and indirect measurement methods well known to those skilled in the art. Upon completion of this optional measurement, the thickness can be further reduced or increased using any of the techniques described above.

Returning now to FIG. 1, in one example wherein lamellar semiconductor 100 is a naturally lamellar semiconductor, lamellae 104A-104D are associated with one another by weak bonding, such as Van der Waals bonding, that extends through inter-lamellar cleavage planes 108A-108C. This type of physical structure is relevant to the present disclosure, and to the fabrication of phosphors for optoelectronic devices, for a number of reasons. As mentioned above, one reason is that the weak inter-layer bonding allows lamellae 104A-104D to be easily removed from lamellar semiconductor 100 in small numbers. This, in turn, facilitates the use of lamellae 104A-104D as a phosphor for optoelectronic devices. As discussed previously, this feature of lamellar semiconductor 100 can be used to facilitate the processes shown and described in the context of FIG. 2.

Another reason that the physical structure of certain naturally lamellar semiconductors, such as lamellar semiconductor 100 depicted in FIG. 1, is relevant to the present disclosure is that, because lamellae 104A-104D are thin (often on the order of approximately 1 μm to approximately 10 nm), they can be used as optically functional elements with sub-micron dimensions. However, because lamellar semiconductor 100 can be grown to nearly any dimension, it is not solely limited to sub-micron applications. Also, as discussed in more detail below, sufficiently thin groups of lamellae 104A-104D can be used as quantum confinement layers because their thickness approaches that of the de Broglie wavelength of the charge carrier (approximately between 100 nm and 1 nm. A further reason that the physical structure of a naturally lamellar semiconductor, such as lamellar semiconductor 100, is relevant to the present disclosure is that, in contrast to the nanometer-scale thickness of layers 104A-104D along the c-axis, the crystal dimensions in the a-b plane can be millimeters or centimeters long, or longer. This physical anisotropy permits lamellar semiconductor to be used in applications requiring the optically functional element to be nanometers thick along the c-axis, and much larger in the a-b plane. While these three reasons are apparent, other reasons will also become apparent to those skilled in the art in light of the present disclosure.

Some examples of lamellar materials that can be used as lamellar semiconductor 100 for purposes in furtherance of the broad teachings of the present disclosure include those materials listed in paragraph [0027] of PCT Application No. PCT/US11/29190, filed Mar. 21, 2011, and entitled "Methods of Fabricating Optoelectronic Devices Using Layers Detached From Semiconductor Donors and Devices Made Thereby" ("the '190 Application"), which is incorporated by reference for its disclosure of the same.

A specific material that can be used as lamellar semiconductor 100 is GaSe. This inherently lamellar material, in its stoichiometric and non-stoichiometric formulations, can be an intrinsic semiconductor or doped to be an n-type or p-type semiconductor. Its fundamental band gap is approximately in the range of 1.98 eV-2.2 eV. This material property of band gap can, as described later in this disclosure, be further tuned by separating a sufficiently thin layer of GaSe, for example, one or more of lamellae 104A to 104D, from lamellar semiconductor 100. If sufficiently thin, the band gap of a GaSe layer can increase to approximately in the range of 2.0 eV-2.7 eV. This latter band gap shift enables LEDs, accompanied by a phosphor of GaSe as an optically functional element, to emit light having wavelengths from approximately 450 nm to approximately 620 nm, which beneficially includes the green portion of the visible-light spectrum, broadly centered around 555 nm.

The teachings of the present disclosure do not require lamellar semiconductor 100 to be inherently lamellar, but rather also include fabricated lamellar materials. In this case, lamellae 104A-104D can be considered to be artificial, or quasi-lamellar. For example, in some embodiments, lamellar semiconductor 100 can be fabricated by aligning crystallites and forming them into a quasi-lamellar structure using a "semiconductor-paper-forming" process. In this process, anisotropic semiconductor particles are suspended in a fluid medium. The particles are then deposited onto a substrate such that the particles self-align because of their anisotropic morphology. This self-alignment process then forms layer of at least approximately aligned particles on the substrate. The particles may then be bound together to form a unified sheet using a binder, pressure, temperature or other means. This process may be repeated thereby building up a multiple sheets on the substrate, thereby forming the structure shown in FIG. 1, with quasi-lamellae 104A-104D corresponding to the multiple fabricated sheets of aligned semiconductor particles.

Another example of a fabricated lamellar semiconductor material is formed by depositing semiconductor crystallites directly onto a substrate. In this example, crystallites of a semiconductor material are deposited onto a substrate and treated with pressure and/or temperature in order to create a layered, quasi-lamellar semiconductor structure. The crystallites can be dimensionally anisotropic so as self-orient into a textured film when deposited onto the substrate.

FIGS. 3A-3D show the process of cleaving, from a lamellar semiconductor 300, a layer 304, using a substrate 308, which can be either permanent or temporary, so as to create another exemplary embodiment of a phosphor 316 according to an embodiment of the present invention. In one example, lamellar semiconductor 300 is deposited or bonded onto substrate 308 such that when cleavage of the lamellar semiconductor occurs, a layer 304 remains attached to the permanent substrate at a layer/substrate interface 312. In one example, GaSe is used for layer 304 and is deposited onto substrate 308 made, for example, of ZnS. Consistent with the teachings of the present disclosure, after the GaSe crystal has grown sufficiently thick, layers can be cleaved or otherwise detached from it such that the combination of substrate 308 and layer 304 to create phosphor 316. Other types of substrate 308 materials and lamellar semiconductor 300 materials discussed in the present disclosure can also be applied to this teaching.

Exemplary materials that can be used for substrate 308 include, but are not limited to polymers, metals, papers, fabrics, glasses, ceramics, and combinations thereof. Further examples of suitable substrates and the design and configuration of various substrates are stated in at least paragraphs [0037] and [0038] of the '190 Application, which is incorporated by reference for its discussion of the same. The thickness of substrate 308 may range from less than a micron to several millimeters or more as desired by application. Additionally, other functionality/functional layers may be built in or on the substrate prior to (or post) lamination. For example, substrate 308 might be designed and configured to intrinsically act as a planarizing/barrier layer. As additional examples, scratch resistant layers may be deposited on or under the substrate, UV protection layers may be deposited on the substrate or incorporated within the composition of substrate 308, color filters or black mask coatings may be deposited on the substrate, or chemical resiliency coatings, encapsulation coatings, anti-reflective coatings, anti-fingerprint coatings, anti-static coatings, electrically conductive layers/coatings, anticorrosion layers, flame retardant coatings, adhesive layers, polarizing films, retardation films, or combinations thereof, may be deposited on the substrate, prior or post lamination. Moreover, substrate 308 may be textured, roughened, and/or patterned to increase light extraction from an optoelectronic device. In a preferred embodiment, the substrate is non-fluorescing or at the very least not excited by excitation wavelengths used to cause photoluminescence in the one or more layers of the lamellar semiconductor.

Lamellar semiconductor 300 can be deposited onto substrate 308 by, for example, epitaxially depositing a single crystal on the substrate, thereby creating layer 304 in a manner that mimics the highly oriented structure of naturally lamellar semiconductors. Deposition methods are well known in the art, and include homo- and hetero-epitaxial deposition using chemical vapor deposition, molecular beam epitaxy, sputtering, and other techniques. In one example of hetero-epitaxial deposition, the lattice constant of substrate 308 can be approximately equal to that of layer 304. In another example, the lattice constants can be highly mismatched. This mismatch may be acceptable because some lamellar semiconductor materials, in particular GaSe, can have intrinsic compliance in their crystal structures that can accommodate epitaxial mismatch.

Substrate 308 can alternatively be bonded to a bulk lamellar semiconductor 300 or to only a separated layer 304 via, for example, chemical bonding and microwave bonding. Examples of chemical bonding include the use of water or solvent soluble epoxies, adhesive, RTV, silicones, urethanes, liquid metals, etc. The chosen bonding chemical(s) may be cured/activated using plasma, light, UV, temperature, pressure, anaerobic environment, etc. Bonding may also be initiated by surface treatments using, for example, chemicals, activated plasma treatments, and vacuum processes. Bonding processes may also include, for example, microwave bonding, anodic bonding, fusion bonding, adhesive, eutectic, resist, solder, thermocompression, and low temperature glasses. Further examples of bonding methods and techniques are disclosed in U.S. Provisional Applications Nos. 61/573,873 and 61/629,098 listed above in the Related Application Data section and incorporated herein by reference for all of their teachings on bonding methods and techniques. Possible features used to select substrate 308 include, but are not limited to, lattice constant, rigidity, flexibility, degree of transparency, and electrical conductivity.

For those embodiments of the foregoing processes in which layer 304 is deposited on substrate 308, any deposition technique that preserves or enhances the lamellar character of the lamellar semiconductor can be used. Exemplary techniques are discussed at least in paragraph [0039] of the '190 Application, which is incorporated by reference for its discussion of the same.

Figure 4:
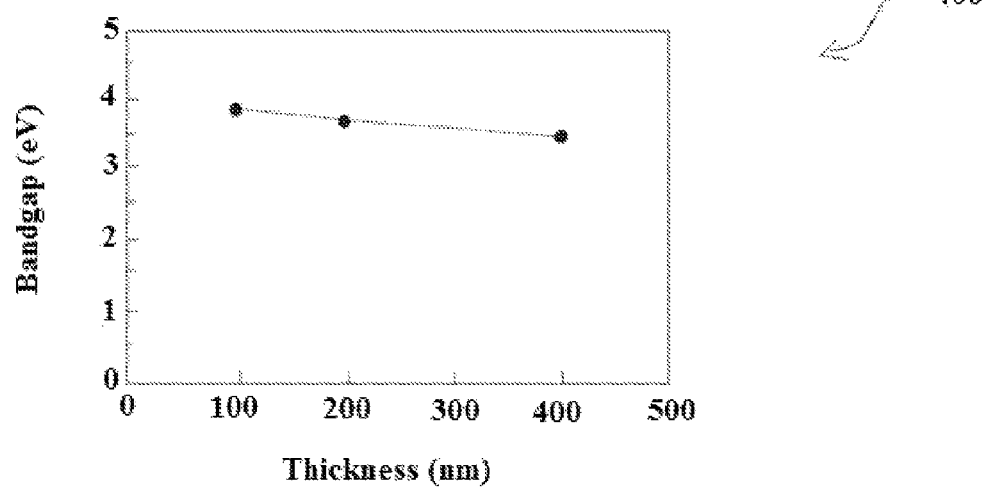
FIG. 4 depicts a relationship between layer thickness and the band gap of a material.
Figure 5:
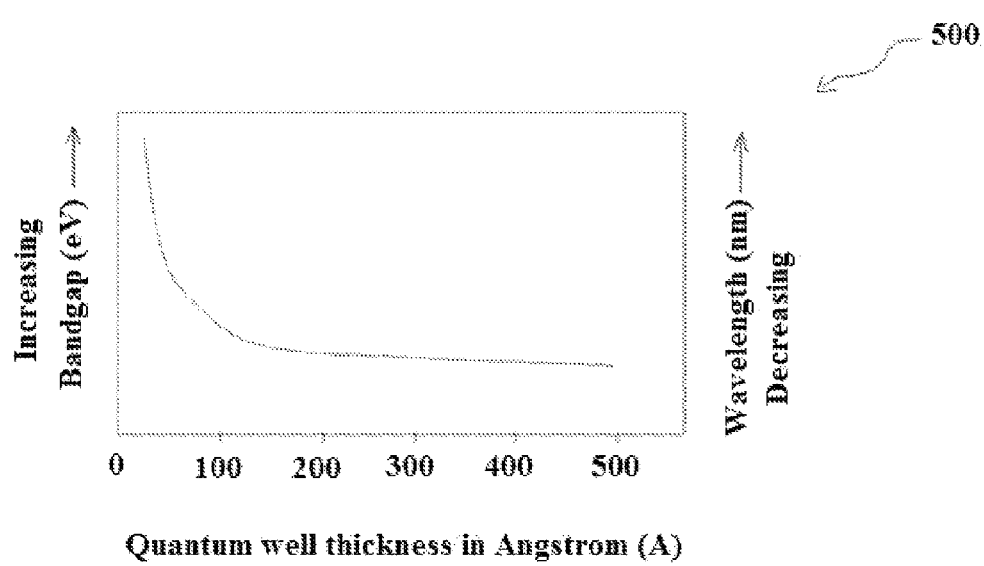
FIG. 5 further depicts a relationship between layer thickness and the band gap of a material for layers having at least one dimension less than 300 Angstroms, and particularly less than 100 Angstroms.

Turning now to FIGS. 4 and 5, band gap, while primarily an intrinsic material property, can be tailored by adjusting the thickness of an optically functional element to be less than 100 nm, and preferably to less than 10 nm, in order to induce quantum confinement effects within the element. This relationship between thickness and band gap is shown in graph 400 of FIG. 4 and can be deliberately exploited by thinning the optically functional element by, for example, cleaving and/or thinning as described above. Furthermore, as depicted in graph 500 of FIG. 5, because of quantum confining effects, the shift in band gap is accentuated for structures having at least one dimension less than 500 Angstroms, and preferably less than 100 Angstroms.

A layer, including one from a lamellar semiconductor material, can function as a quantum-confinement structure in cases where at least one dimension of the layer is on the order of the de Broglie wavelength of a charge carrier. A structure having one, two, or three dimensions less than the de Broglie wavelength is often referred to as a quantum confinement layer (also known as a quantum well), a quantum-wire, or a quantum dot respectively. As discussed above, at least one dimension must be approximately less than 100 nm, and preferably less than approximately 10 nm, to be on the order of the de Broglie wavelength. In this regard, for those lamellar semiconductors having a lamellar thickness on the order of 10 nm, a quantum well can be formed by detaching only a few lamellae, thereby producing a detached layer on the order of the de Broglie wavelength. Lamellar layers are not limited to functioning as quantum wells, however. In other examples, a lamellar quantum well can be further divided along one or more Cartesian axes (as shown in FIG. 1) so as to form a quantum-wire or a quantum dot.

As discussed above with respect to FIGS. 4 and 5, quantum confining structures can cause a shift of the band gap that is inherent to the bulk material forming the structure. Particularly, as one or more dimensions of a layer is/are reduced below 100 nm, and preferably less than approximately 10 nm, the band gap increases. This band gap shift in turn decreases the wavelength of light emitted. The application of quantum confinement structures to intentionally shift the band gap of the layer can be applied to the teachings of the present disclosure.

Lamellar Semiconductor Phosphors

Figure 6:
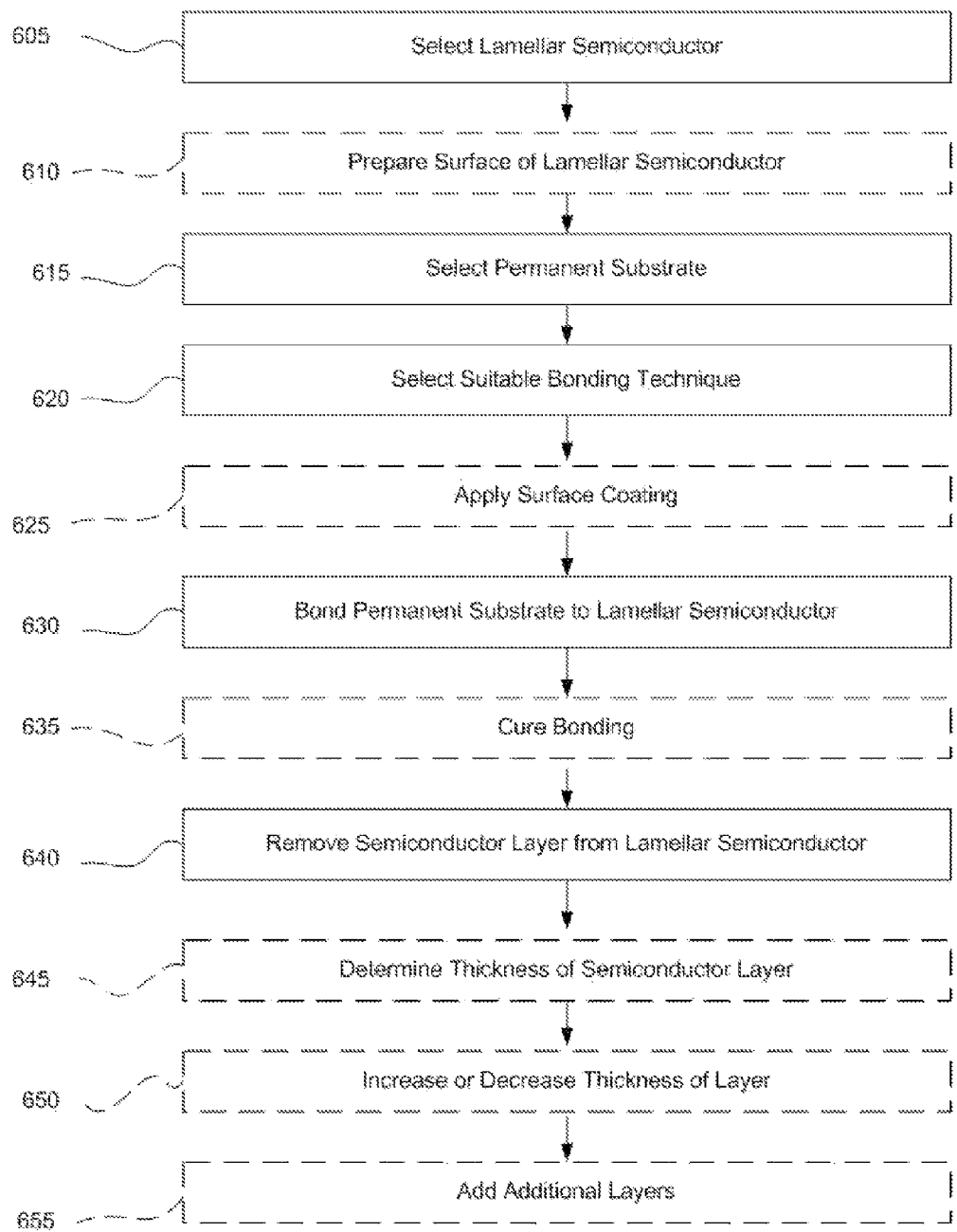
FIG. 6 is a block diagram of another method of fabricating a phosphor according to another embodiment of the present invention.

As presented above, the detached layer from a lamellar or quasi-lamellar semiconductor can be attached to a permanent substrate and thereafter used as a phosphor. As a particular example, FIG. 6 illustrates a method 600 that uses portions of method 200 to fabricate a phosphor 700 (FIG. 7G) that converts the wavelength of light received from an optoelectronic device. As will become apparent from reading on, the steps of method 600 need not necessarily be performed in the order presented to achieve an equivalent result.

Referring now to FIG. 6, and also to FIGS. 7A-7G, at step 605 of method 600, a lamellar semiconductor 704 (FIG. 7A) is selected based on factors and criteria discussed elsewhere in this document. After lamellar semiconductor 704 has been selected, a surface 708 of the lamellar semiconductor can be prepared at optional step 610. This optional step typically includes cleaning surface 708 of lamellar semiconductor 704. Cleaning techniques are well known in the art and include wet or dry chemical etching, plasma cleaning, and UHV annealing, among others.

At step 615, a permanent substrate 714 (FIG. 7C) is selected based on factors and criteria discussed elsewhere in this disclosure. At step 620, a suitable bonding technique (as discussed elsewhere herein) is chosen.

At optional step 625, a surface coating 712 (FIG. 7B) is incorporated into or on permanent substrate 714 as described above. Surface coating 712 may include, but is not limited to, anti-reflective, anti-fingerprint, anti-static, anti-corrosion, chemical resiliency, UV protection, electrically conductive, polarizing, and scratch resistant coatings, individually and in combination with one another. Furthermore, permanent substrate 714 can be textured, roughened, or patterned to increase light emission from the device. Other options can be incorporated as those skilled in the art are well aware.

Figure 7A:
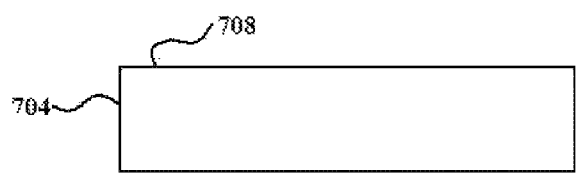
FIGS. 7A-7G are schematic illustrations of the fabrication of a phosphor according to an embodiment of the present invention.
Figure 7B:
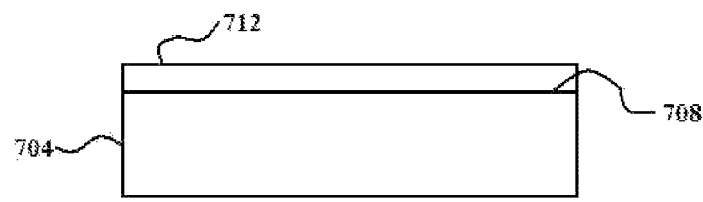
Figure 7C:
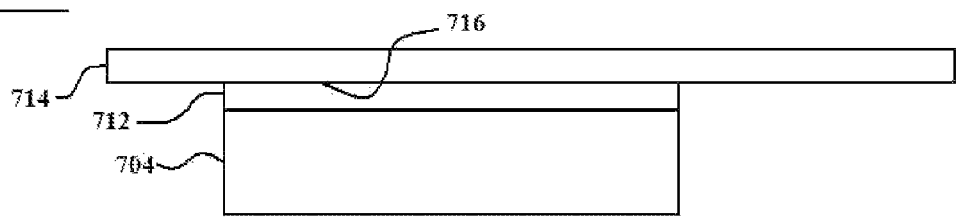
Figure 7D:
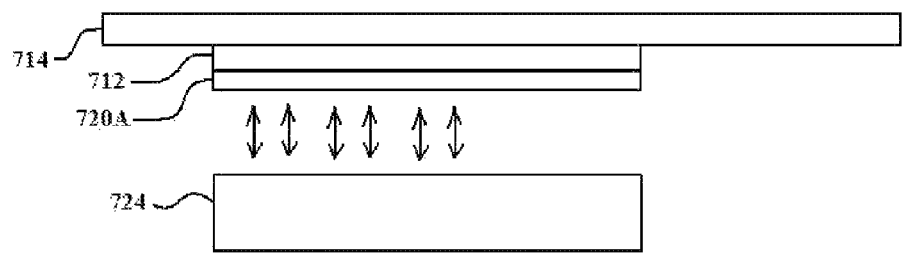
Figure 7E:
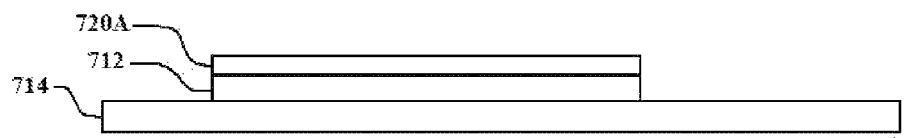

At step 630 permanent substrate 714 (FIG. 7C) is bonded to lamellar semiconductor 704 and attachment surface 716. In the embodiment shown in FIG. 7C, lamellar semiconductor 704 is bonded to permanent substrate 714 via surface coating 712. Depending on the nature of permanent substrate 714 and the type of bond desired, the semiconductor/substrate bond can be cured at optional step 635 by methods discussed elsewhere herein. At step 640, and as depicted in FIG. 7D, a semiconductor layer 720A is detached from lamellar semiconductor 704 at a desired location so as to leave the layer attached to permanent substrate 714. The removal of semiconductor layer 720A leaves a thinner lamellar semiconductor 724 that may be reused until all the layers have been depleted from it. After semiconductor layer 720A has been separated from lamellar semiconductor 704, the thickness of the semiconductor layer can be measured at optional step 645 in order to determine whether the thickness is sufficient to meet the design of phosphor 700 (FIG. 7G), as previously discussed in the context of FIG. 2. Similarly, at optional step 650 (FIG. 7E (note that the stack has been inverted from FIG. 7D to facilitate understanding of the additional steps discussed below)), the thickness of semiconductor layer 720A can be increased or decreased, if needed or as desired in the context of the device design criteria and using methods previously described and also those methods well known to the skilled artisan.

Figure 7F:
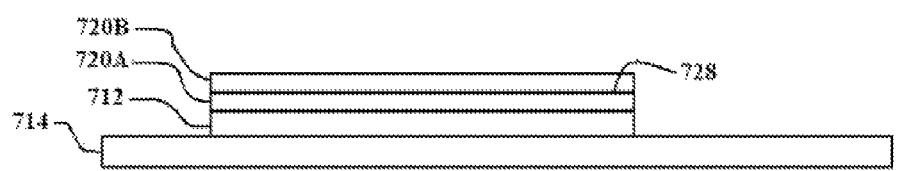
Figure 7G:

At step 655, illustrated by FIG. 7F, one or more semiconductor layers, such as semiconductor layer 720B, may be added to semiconductor layer 720A by stacking the layers and adhering or bonding them together as described elsewhere herein. Bonding surface 728 may also be prepared according to techniques described elsewhere herein prior to attachment of a subsequent layer. Alternatively, a separator coating layer 732 may be deposited on semiconductor layer 720A, which can be followed by additional semiconductor layers 720B (FIG. 7G). The use of separator coating layer 732 may be preferred when the thickness of the phosphor needs to be increased so that substantially all of the input radiation (light) is absorbed by the phosphor. Separator coating layer 732 may include many different types of materials including metals and organic materials. Further examples of separator coating layers 732 and methods and techniques of attaching the separating coating layer to semiconductor layers are disclosed in U.S. Provisional Application Nos. 61/573,873 and 61/629,098 noted above in the Related Application Data section and incorporated herein by reference for their teachings of separator coating layers and methods and techniques for attaching such layers.

Alternatively, separator coating layer 732 may be a semiconductor coating so as to facilitate the creation of quantum well structures, making the resultant phosphors more efficient light converters. There are two primary embodiments that would result from using a semiconductor coating as separator coating layer 732. In an embodiment, the band gap of the deposited semiconductor separator coating 732 is greater than band gap of lamellar semiconductor layer 720, but less than the band gap of input light. In this embodiment, separator coating layer 732 serves to absorbs input light resulting in the output light having a composite spectra consisting of a photoluminescent spectra of lamellar semiconductor layer 720 plus the photoluminescent spectra of the semiconductor separator layer 732. In another embodiment, the band gap of deposited semiconductor separator coating 732 is greater than band gap of lamellar semiconductor layer 720, and greater than the band gap of input light. In this embodiment, the separator coating layer 732 does not absorb input light. Exemplary materials that may be a semiconductor coating layer 732 are disclosed in U.S. Provisional Application Nos. 61/573,873 and 61/629,098 noted above in the Related Application Data section.

Figure 8:
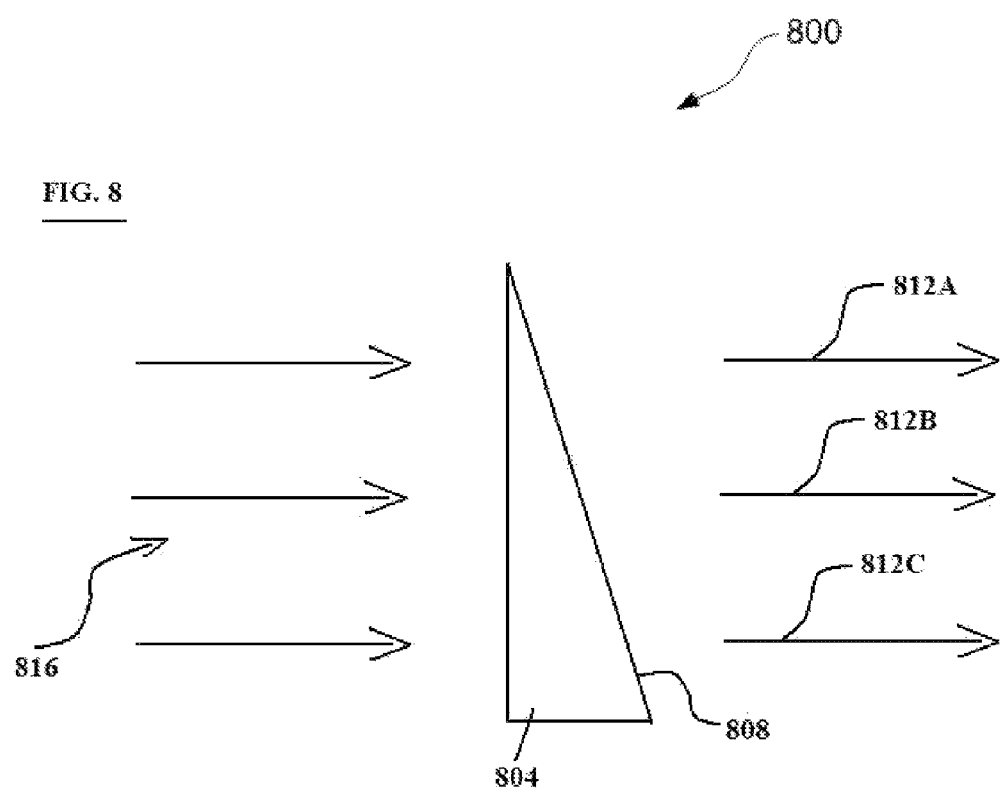
FIG. 8 is a schematic illustration of a phosphor having a non-uniform thickness profile.

Referring now to FIG. 8, there is shown an embodiment of a phosphor 800 comprising a lamellar semiconductor layer 804 having a non-uniform profile 808. In the embodiments described above, the lamellar semiconductor layers were of substantially uniform thickness, yielding a singular band gap for that particular thickness and hence resulting in pseudo-monochromatic light emission (light emission with a small wavelength spread) upon illumination with input light. However, in the embodiment shown in FIG. 8, lamellar semiconductor layer 804 has substantially non-uniform profile 808, here a sloped-thickness profile, which results in a multitude of wavelengths, i.e., wavelengths 812A-812C (i.e., multi-chromatic) being output from phosphor 800 after stimulation by input light 816 having a substantially uniform wavelength profile. In alternative embodiments, other geometrical functions with curvatures of the lamellar semiconductor layer 804 are achieved through judicious design.

Exemplary techniques for creating a non-uniform lamellar semiconductor layer, such as layer 804, include etching or ablating the layer to create the layer thickness variation desired. Direct etching may be done by ion beam etching, chemical etching, laser assisted etching, photo-ablation, directed plasma etching etc. Alternatively, techniques such as gray scale lithography, micro/nano imprinting, may be used to create the desired patterns in a photoresist. The pattern is subsequently transferred into the lamellar semiconductor layer by using isotropic or anisotropic etching mechanisms to create the layer thickness variation desired.

Returning briefly to the discussion of FIG. 3 above, it was indicated above that layered semiconductor (and layered insulator and layered conductors) materials can serve as ideal templates for the hetero-epitaxial growth of highly mismatched semiconductor materials. With this understanding, another alternative for the type of materials usable as phosphors presents itself, namely, wide band gap II-VI materials on layered material templates. The resultant single crystal thin films of II-VI materials may be either Wurtzite or Zinc Blende in crystal structure. The II-VI materials may be composed of binary, ternary or quarternary combinations such as, but not limited to, ZnS, ZnSe, ZnSSe, ZnTe, ZnSTe, ZnSeTe, CdS, CdSe, CdTe, CdSSe, CdSTe, CdSeTe, HgS, HgSe, and HgTe. As with the lamellar semiconductors and insulators of FIG. 3, the thickness of the II-VI single crystal coatings may be from less than 1 nm to greater than 10 s of microns, there being no fundamental limits on the thickness of the coatings.

When implemented as a single crystal coating layer, the II-VI single crystal coating layer maybe composed of one II-VI material composition or might be a multi-layer stack of many different II-VI material compositions one on top of the other. The layered substrate may be absorbing or non-absorbing of the input light. If it absorbs some of the input light, it may have its own photoluminescence signature super-imposed with the photoluminescence signature of the II-VI coating layer atop it in the output light. The layered single crystal material, be it natural or synthetic, may have chemical compositions containing oxides, sulphides, selenides, tellurides, fluorides, chlorides, bromides, iodides, borides, nitrides, carbides, phosphides, arsenides, silicides, or any combination thereof. The layered single crystal material may be a conductor, an insulator, or a semiconductor as disclosed in the earlier embodiments. Insulator type layered material may include mica, gypsum, layered silicates, Li2Si2O5, phyllosilicates, intercalation/intercalating clays etc. These belong to a family of layered material more generally referred to as "micaceous", "layered", or lamellar. Further discussions of insulators are disclosed in U.S. Provisional Application Nos. 61/573,873 and 61/629,098.

As an alternative to the use of a bulk II-VI semiconductor film, quantum confining layers composed of II-VI semiconductors can be devised that would be significantly more efficient phosphors. These quantum confining structures may take the form of quantum wells, quantum wires, quantum dots, etc. Exemplary combinations of semiconductor materials that will yield such quantum confining structures are below:

Material Combination 1:

Layered substrate: GaSe (Lattice constant: ~3.74 A)

Barrier layers: ZnS (Lattice constant: 3.82 A, crystal structure—Wurtzite)

Quantum confining layer: CdSe (Lattice constant: 4.30 A, crystal structure—Wurtzite)

Material Combination 2:

Layered substrate: GaSe (Lattice constant: ~3.74 A)

Barrier layers: ZnS (Lattice constant: 3.82 A, crystal structure—Wurtzite)

Quantum confining layer: CdS (Lattice constant: 4.14 A, crystal structure—Wurtzite)

Material Combination 3:

Layered substrate: GaSe (Lattice constant: ~3.74 A)

Barrier layers: ZnS (Lattice constant: 3.82 A, crystal structure—Wurtzite)

Quantum confining layer: HgS (Lattice constant: 4.14 A, crystal structure—Wurtzite)

Material Combination 4:

Layered substrate: GaSe (Lattice constant: ~3.74 A)

Barrier layers: ZnS (Lattice constant: 3.82 A, crystal structure—Wurtzite)

Quantum confining layer: $Cu_xS$ (Lattice constant: 3.78-3.98 A, crystal structure—Wurtzite)

Material Combination 5:

Layered substrate: $Bi_2Te_3$ (Lattice constant: ~4.38 A) or $Bi_2Se_3$ (lattice constant: ~4.15 A)

Barrier layers: CdS (Lattice constant: 4.14 A, crystal structure—Wurtzite) or ZnTe (Lattice constant: 4.27 A, crystal structure—Wurtzite)

Quantum confining layer: CdSe (Lattice constant: 4.30 A, crystal structure—Wurtzite) or HgS (Lattice constant: 4.14 A, crystal structure—Wurtzite)

Material Combination 6:
Layered substrate: GaSe (Lattice constant: ~3.74 A)
Barrier layers: ZnSe (Lattice constant: 4.0 A, crystal structure—Wurtzite) or $Cu_xS$ (Lattice constant: 3.78-3.98 A, crystal structure—Wurtzite)
Quantum confining layer: $Cu_xS$ (Lattice constant: 3.78-3.98 A, crystal structure—Wurtzite)

Designs of Phosphors and their Uses

Figure 9:
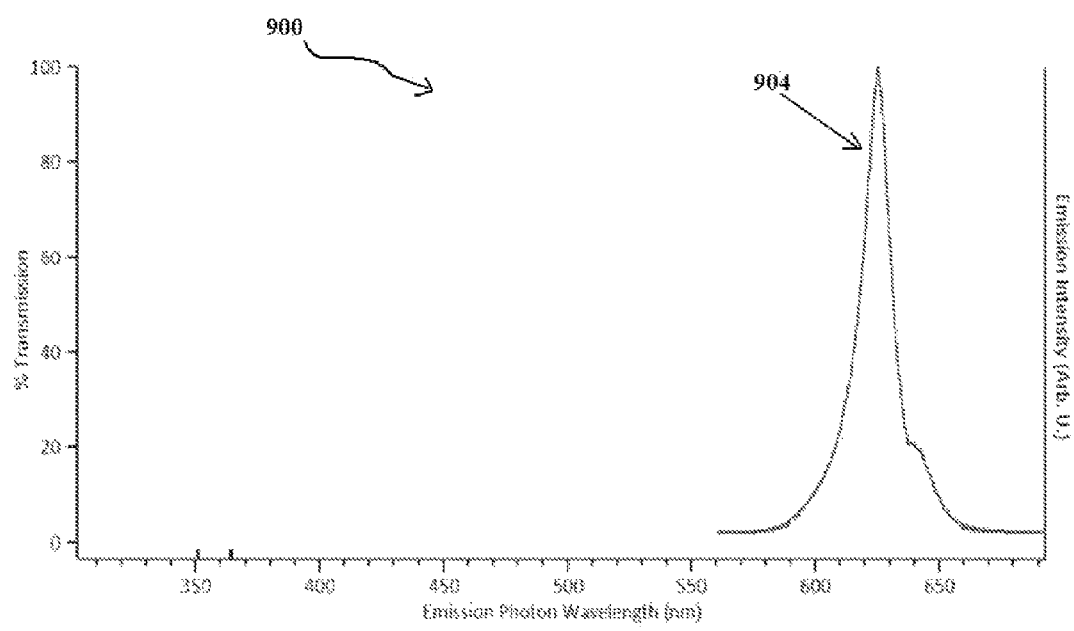
FIG. 9 is a photoluminescence spectroscopy diagram of luminescence versus wavelength for a thin layer of GaSe.

It is well known that in the solid state lighting marketplace "warm white" is preferred for general lighting. One of the ideal techniques for converting the cold blue of light emitting diodes available commercially is to include a narrow band red-emitting phosphor to improve color correlated temperature (CCT) and/or color rendering index (CRI). For example, the ideal center wavelength of emission of a red phosphor is around 610 nm to 615 nm with a narrow 50% bandwidth of about 30 to about 40 nm. Using methods described herein, such as method 200, a phosphor can be configured to be a red phosphor with an emission between about 600 nm to about 640 nm, with a narrow bandwidth of about 30 nm, thereby providing "warm white" lighting. A specific example is shown in FIG. 9, which examines the photoluminescence of a layer of GaSe. Spectra diagram 900 shows that the GaSe has an emission 904 of about 625 nm. The bandwidth in this example is approximately 30 nm.

As another example, phosphors fabricated according the methods and designs described herein can increase the efficiency of certain photovoltaic devices, such as solar cells. The increase in efficiency may be accomplished by leveraging optical phenomenon such as down-conversion of incident solar photons, such that the phosphor splits the energy of high-energy photons into two photons of lower energy that can then be absorbed in the photovoltaic device more closely matched to the band gap energy, thereby avoiding thermalization (i.e., heating) losses. Alternatively, a phosphor may be used to down-convert (wavelength or frequency shifted) the UV and blue photons to the red and NIR regions so as to better match the spectral efficiency of the solar cells.

As yet another example, lamellar semiconductors, such as GaSe or other thin films of II-VI semiconductor materials, may be bound by mirror reflector coatings (such as distributed Bragg reflector (DBR) coatings) to realize optically pumped lasers. The architecture of these optically pumped lasers may be varied and take the form of optically pumped vertical cavity surface emitting lasers (VCSELs), vertical external cavity surface emitting lasers (VECSELs), optically pumped semiconductor vertical external cavity surface emitting laser (OPS-VECSELs), vertical cavity semiconductor optical amplifier (VCSOAs), optically pumped semiconductor lasers (OPSLs), semiconductor disk lasers (SDLs), etc.

Figure 10:
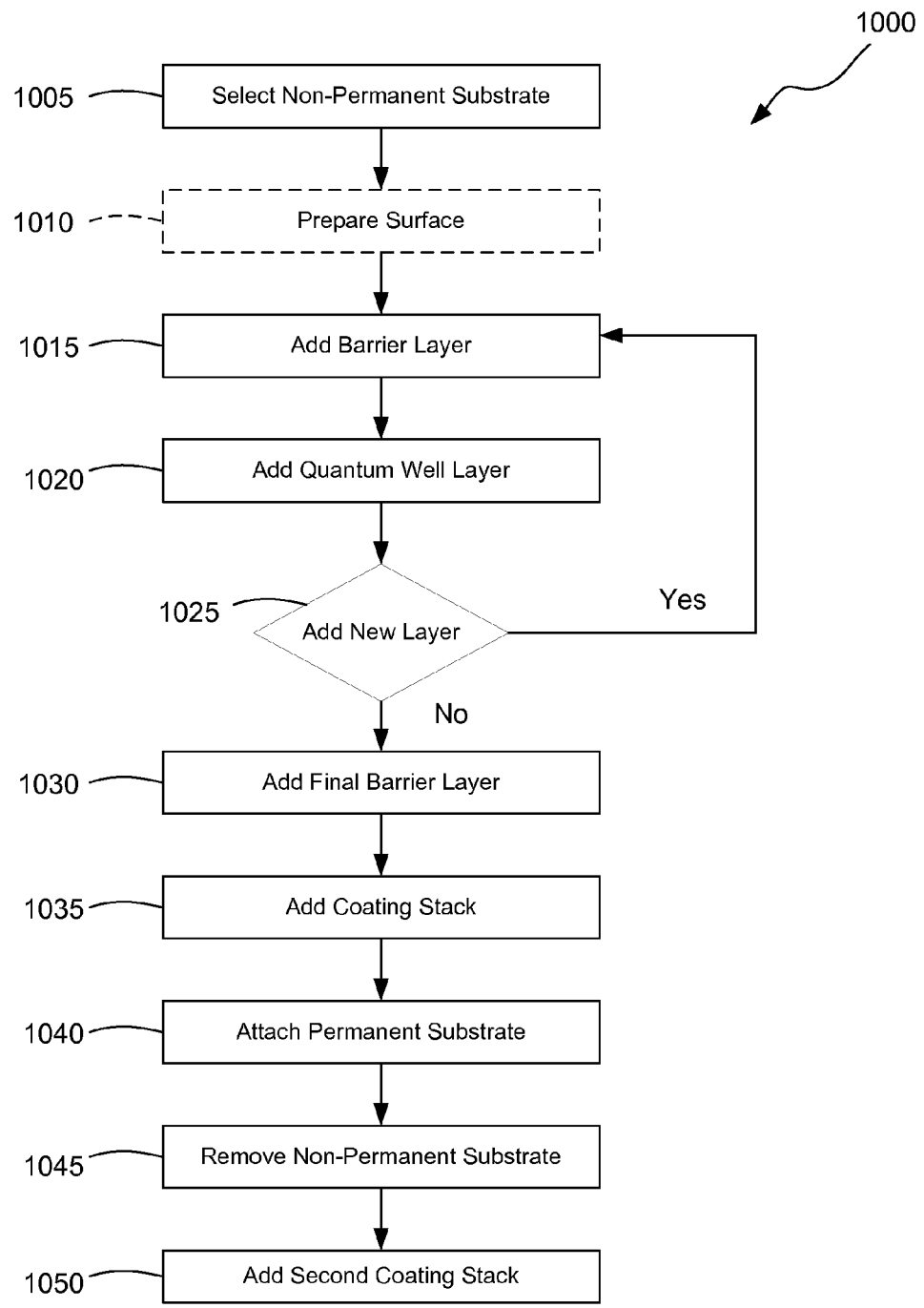
FIG. 10 is a block diagram of yet another method of fabricating a phosphor according to an embodiment of the present invention.
Figure 11A:
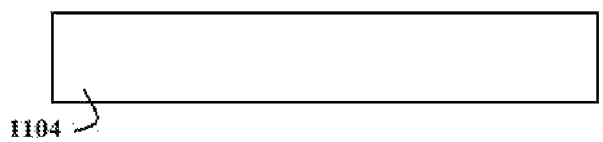
FIGS. 11A-11J are schematic illustrations of the fabrication of a phosphor generally according to the method shown in FIG. 10.

An exemplary method of fabricating a phosphor that is bounded by mirror reflected coatings is shown in FIG. 10 and with reference to FIGS. 11A-J. Method 1000 begins at step 1005 in which as a non-permanent substrate 1104 is selected (FIG. 11A). Non-permanent substrate 1004 serves to provide the foundation for the remaining layers that comprise phosphor 1100 (FIG. 11J). In an exemplary embodiment, non-permanent substrate 1104 is a GaSe wafer.

At step 1010, the surface of non-permanent substrate 1104 may be optionally cleaned and/or otherwise prepared prior to the stacking of additional layers. Techniques for cleaning and preparing the surface of non-permanent substrate 1104 are described elsewhere herein.

Figure 11B:
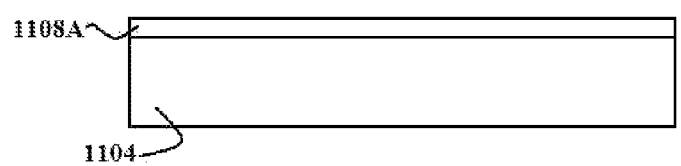
Figure 11C:
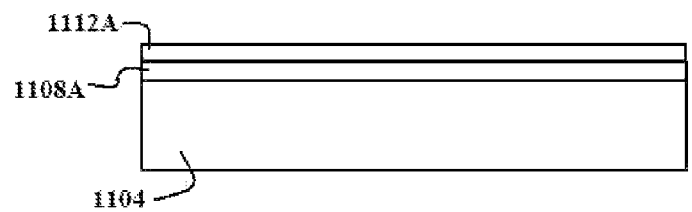

At step 1015, a barrier layer 1108A is deposited or grown to the appropriate thickness on top of a surface of non-permanent substrate 1104 (FIG. 11B). In an exemplary embodiment, barrier layer 1108A is composed of ZnS. In another exemplary embodiment, barrier layer 1108A is CdS. In another exemplary embodiment, barrier layer 1108A maybe composed of semiconductor or insulator materials as described elsewhere herein. The thickness will of barrier layer 1108A depends on the desired wavelength of operation, input pump wavelength, and other considerations known the skilled artisan.

At step 1020, a appropriate quantum well layer 1112A (FIG. 11C) of a semiconductor material is deposited, placed, or grown on top of the barrier layer 1108A. In an exemplary embodiment quantum well layer 1112A is GaSe. In another exemplary embodiment, quantum well layer 1112A is CdSe. In yet another exemplary embodiment, quantum well layer 1112A GaSe is a II-VI semiconductor material, with either a Zinc Blende or Wurtzite structure. The thickness of quantum well layer 1112A depends on the desired wavelength of operation, input pump wavelength, and other considerations known the skilled artisan.

Figure 11D:

At step 1025, one or more of steps 1015 and 1020 may be repeated as desired so as to create the number of quantum wells as called out by the design for the particular wavelength of operation and application desired. As shown in FIG. 11D, on the surface of non-permanent substrate 1104 is a barrier layer 1108A, followed by a quantum well layer 1112A, which is followed by another barrier layer 1108B and another quantum well layer 1112B. Barrier layer 1108A need not be the same as barrier layer 1108B, and quantum well layer 1112A need not be the same as quantum layer 1112B. The choices for the various layers and the options for creating the various layers are described elsewhere herein.

Figure 11E:
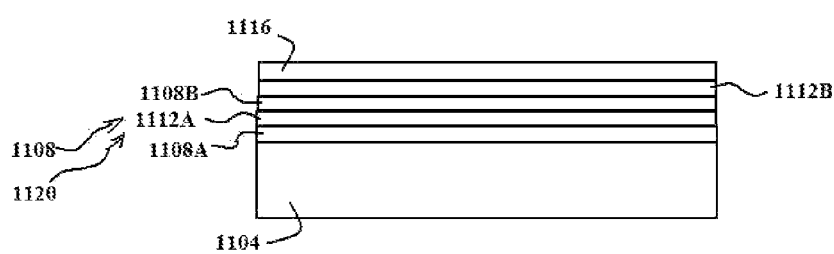

Regardless of the number times steps 1015 and 1020 are repeated, at step 1030 a final barrier layer 1116 (FIG. 11E) having an appropriately designed thickness is deposited, placed, or grown on the exposed quantum well layer 1112 (as shown in FIG. 11E, quantum well layer 1112B) (collectively, the quantum well layers 1112, barrier layers 1108, and final barrier layer 1116 will be referred to as stack 1120). As with the other layers described above, the thickness of final barrier layer 1116 depends on the desired wavelength of operation, input pump wavelength, and other considerations known the skilled artisan. For example, the materials used for quantum well layer 1112 and barrier layer 1108 may have band gaps that allow for the absorption of the input/pump wavelength light 1136 (FIG. 11J) in the quantum well layer or in both the quantum layer and the barrier layer.

Figure 11F:
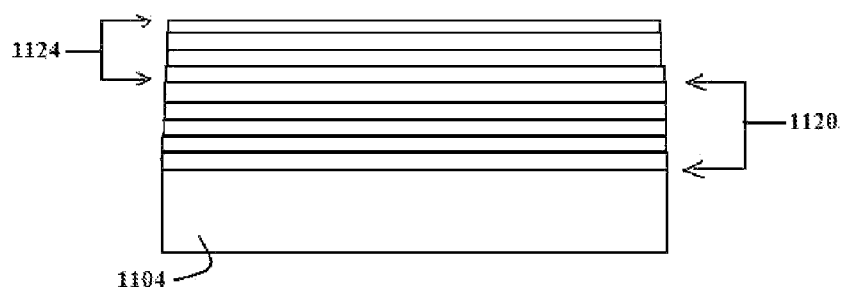
Figure 11G:
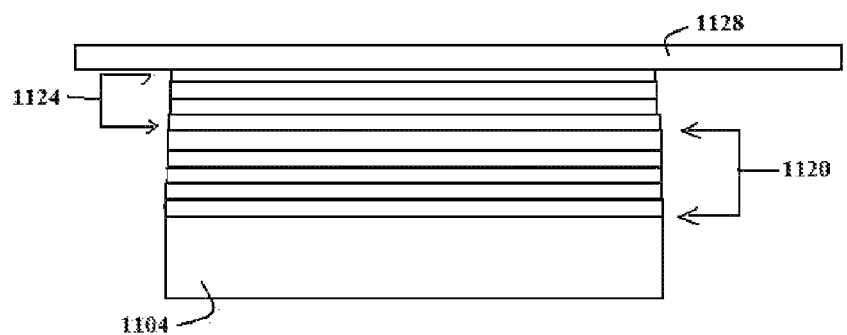

At step 1035 a reflector coating stack 1124 (FIG. 11F) or mirror coating is deposited atop stack 1120. Coating stack 1124 is designed such that, upon device completion the resonator will constructively resonates for the output wavelength. As shown in FIG. 11F, coating stack 1124 may include differing layers of materials designed to provide the appropriate resonation of the output wavelength. Coating stack 1124 may be made up of metal, semiconductor, or dielectric insulator layers. In an embodiment, coating stack 1124 is made of insulating or wide band gap semiconductors (i.e., materials that do not absorb input/pump light wavelengths).

An optional heat sink layer (not shown) may be attached or bonding to coating stack 1124 using techniques described herein. The heat sink or heat spreading material may be made up of any material listed in the permanent substrate materials revealed earlier. For example, the heat sink material may be uncoated sapphire, SiC, diamond, diamond like coating (DLC), graphite, graphene, mica, or any combination thereof.

At step 1040, a permanent substrate 1128 (FIG. 11G) is attached or bonded to the exposed surface of coating stack 1124 (or the heat sink layer (if present)).

Figure 11H:
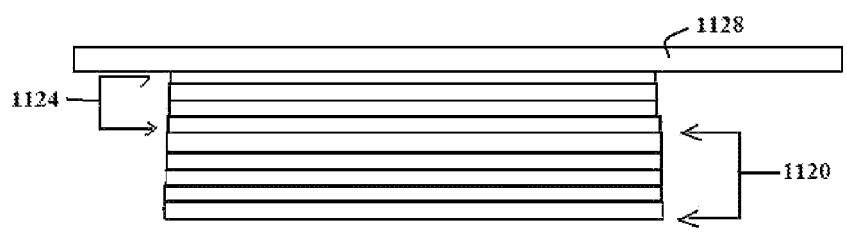
Figure 11:
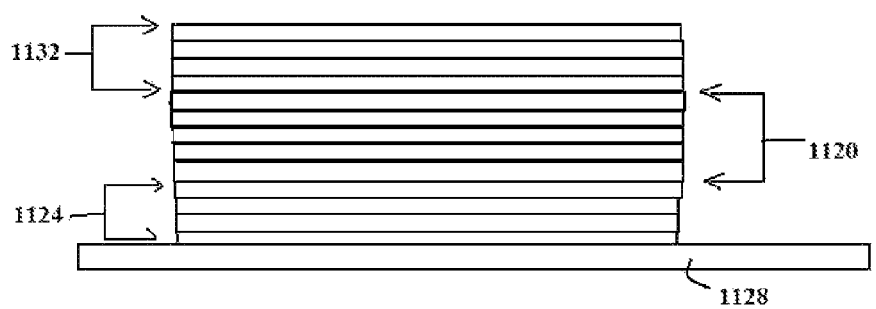
Figure 11:
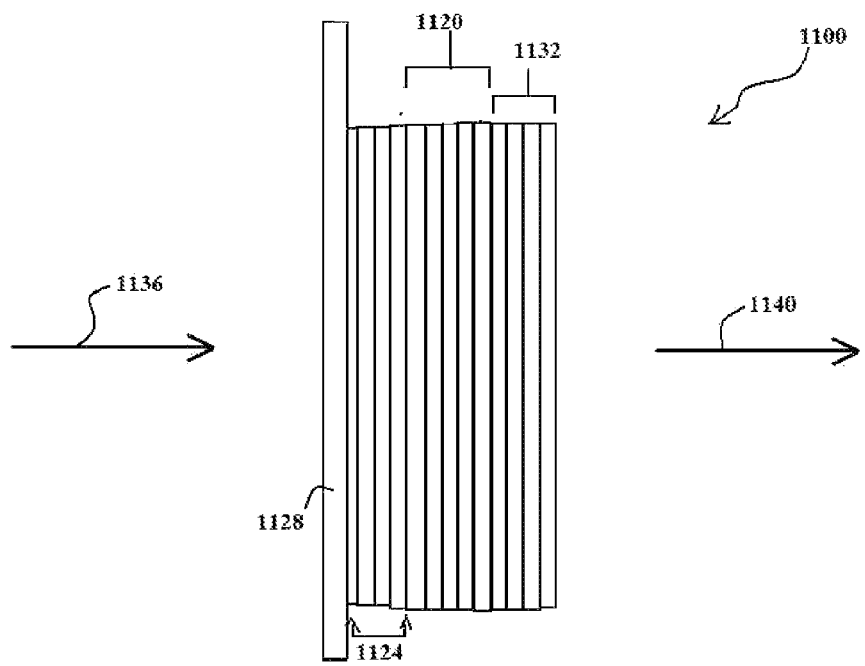

At step 1045, some or all of non-permanent substrate 1104 is removed. In an exemplary embodiment, removal of some or all of the non-permanent substrate is accomplished via cleaning. As shown in FIG. 11H, all of non-permanent substrate 1104 is removed from stack 1120, leaving stack 1120 and coating stack 1124 attached to permanent substrate 1128.

At step 1050, and in the embodiment shown in FIG. HI, a second reflector coating 1132 is deposited on the surface of stack 1120 opposite coating stack 1124. As with coating stack 1124, reflector coating 1132 is designed and configures such that, upon device completion, the resonator will constructively resonates for the output wavelength. As suggested above in step 1045, not all of the non-permanent substrate 1104 may be removed from stack 1120. Thus, depending on the non-permanent substrate material (for example, if GaSe is used), another final barrier layer 1116 (not shown) may need to be added to stack 1120 (opposite the first barrier layer) prior to attaching reflector coating 1132.

In an alternative embodiment of phosphor 1100, non-permanent substrate 1104 may be transparent such that it does not absorb the pump input light 1136. In this embodiment, it may not be necessary to remove any of non-permanent substrate 1104 as proposed in step 1045 of method 1000. As another alternative embodiment, quantum well layers 1112 may be replaced by any other quantum confining layer, such as quantum dots or quantum wires and combinations of quantum wells, quantum wires, and quantum dots may be used in combination if so desired. In another embodiment of phosphor 1100, a window layer (not shown) with a larger band-gap (e.g., transparent) may be deposited between layers (such as non-permanent substrate 1004 and barrier layer 1008) to provide a surface barrier that prevents carriers from diffusing to the non-permanent layer where they could recombine non-radiatively and affect the efficiency of laser action. This window layer may also be added to exposed surfaces the structure so as to reduce surface oxidation.

Figure 14:
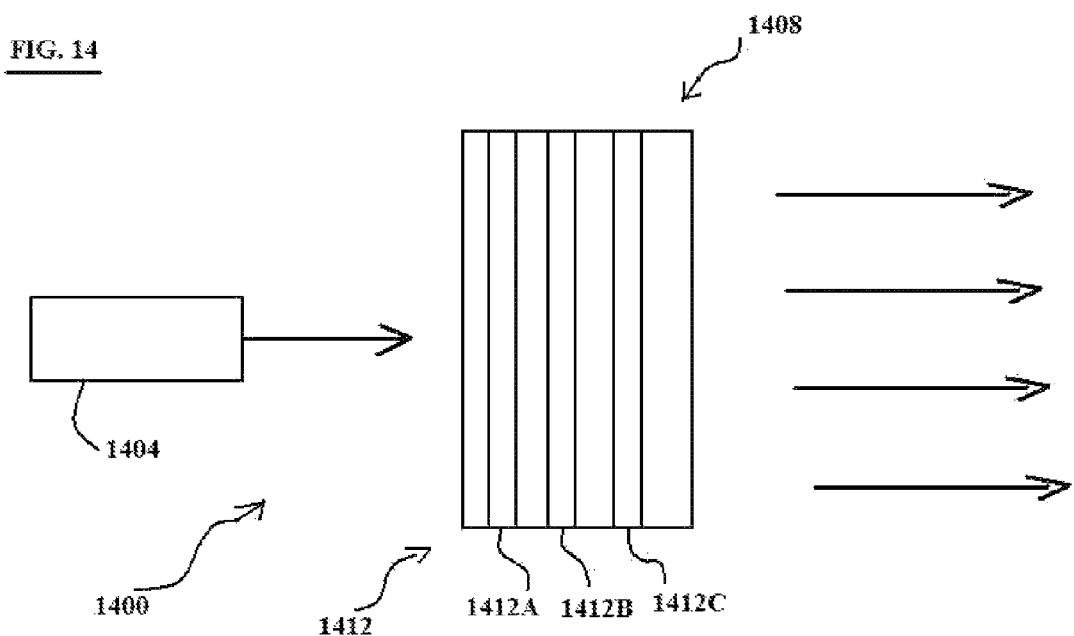
FIG. 14 is a schematic diagram of yet another exemplary device using multiple phosphors according to an embodiment of the present invention.

As shown in FIG. 11J, the resulting phosphor 1100 receives an input pump light 1136 having a certain wavelength and frequency and produces an output laser light 1140 having a desired wavelength and frequency, at least one of which is different than the input pump light. More specifically, the output wavelengths can be tailored in terms of wavelength and bandwidth by choice of judicious design of the quantum well layers 1112 and barrier layers 1108 to generate a specific CRI. For example, and as shown in FIGS. 12-14, phosphor 1100 can be tailored to different light source devices to produce one or more alternative wavelengths.

FIG. 12 shows a device 1200 including a light source 1204 that transmits light to one or more beam splitters 1208, i.e., beam splitters 1208A-C. Each beam splitter 1208 has coupled to it a phosphor 1212, i.e., phosphors 1212A-C, which may be constructed similarly to phosphor 1100 (FIG. 11J). Each respective phosphor downconverts the light input to a different light output. In the embodiment shown in FIG. 12, phosphor 1212A downconverts the light to red light wavelengths, phosphor 1212B downconverts the light to blue light wavelengths, and phosphor 1212C downconverts the light to green light wavelengths.

As another example, FIG. 13 shows a device 1300 that includes a light source 1304 and a beam expander 1308 that has three phosphors 1312, e.g., phosphors 1312A-C, proximate beam expander 1308. In use, light is input to beam expander 1308 from light sources 1304. Beam expander produces multiple light inputs, thereby directing light inputs to each of phosphors 1312A-C. Phosphors 1312A-C downconvert the light received from beam expander 1308 into, in this embodiment, three different light wavelength outputs, such as the red, blue, and green wavelengths discussed above with reference to FIG. 12.

In other embodiments, no beam modifier may be necessary as multiple light sources may be used in combination phosphors or the light source may be capable of sending light at multiple output points such that each output can be coupled to its own phosphor.

FIG. 14 shows yet another device, device 1400, which has an output light of differing wavelengths. In this embodiment, a light source 1404 provides light to a phosphor 1408 that has layers 1412, e.g., layers 1412A-C, that are stacked on top of one other, with each layer having the ability to downconvert light to a different wavelength. In the embodiment of device 1400 shown in FIG. 14, a first layer 1412A downconverts the input light to the red wavelength, a second layer 1412B downconverts the input light to the green wavelength, and a third layer 1412C downconverters the input light to the blue wavelength. The output of the phosphor 1408 is a multi-chromatic output of light in, what can be, narrowly defined wavelengths, with judicious design of the phosphor using the methods and techniques described herein.

Although only three phosphors and three light wavelengths have been identified in the aforementioned examples, more phosphors and different output wavelengths are possible depending on the design of the phosphor, e.g., phosphor 1212, 1312, and 1408.

The design and configuration of one or more of the phosphors described herein may also allow for input pump light absorption "in-well" and/or in the "barrier" layer. Additionally, quantum well layers used in the phosphors may be spatially positioned at the anti-nodes of the output laser optical standing wave, thus forming a Resonant Periodic Gain (RPG) structure.

Figure 15A:
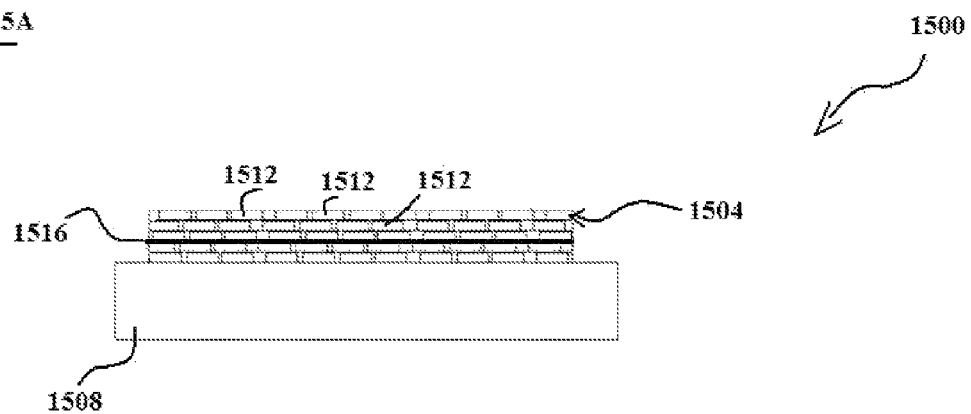
FIG. 15A is a schematic illustration of a fabricated lamellar semiconductor on a permanent substrate according to an embodiment of the present invention.

Although the previous phosphor embodiments have largely focused on the use of single crystals of the lamellar semiconductor, an alternative device 1500, as shown in FIG. 15A, is to deposit preferentially oriented (textured) crystalline films 1504 of lamellar semiconductors on top of a substrate 1508, such as single crystal surrogate wafer(s), polycrystalline surrogate wafer(s), or amorphous wafer(s) (e.g., glass). Individual crystallites 1512 that make up the film/coating are preferentially deposited such that the cleavage planes of the crystallites are substantially parallel to the surface of the surrogate substrate so as to facilitate cleaving of one or more layers after the depositing along a cleavage plane 1516. For example, and as shown in FIG. 15A, individual crystallites 1512 (also called platelets) are closely/densely packed next to each other and can be an assortment of sizes with variable spacing in between them.

Figure 15B:
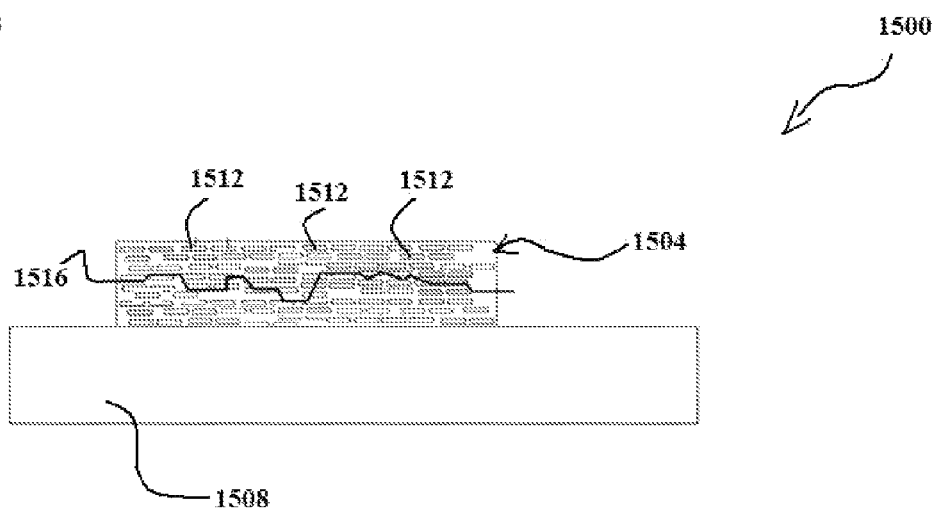
FIG. 15B is a schematic illustration of another fabricated lamellar semiconductor on a permanent substrate according to an embodiment of the present invention.

Advantageously, since deposited film 1504 of the lamellar semiconductor atop surrogate substrate 1508 is preferentially oriented crystallites 1512, cleavage front 1516 in such a material need not propagate in a singular plane. Rather the cleavage front 1516 might travel in somewhat arbitrary random haphazard pattern, as shown in FIG. 15B, around localized regions of weak bonding in and between the individual crystallites 1512 that make up the coating. Therefore, upon cleaving and detaching layered semiconductor 1504 from surrogate substrate 1508, the layered semiconductor coating thickness may be non-uniform. This will advantageously allow for the construction of phosphors 1500 with differing band gaps and hence differing color spectrums.

The preferentially oriented layered semiconductor coatings may be deposited on a suitable surrogate substrate by using any of the following deposition techniques, but not limited to, chemical vapor deposition, sputtering, or PLD techniques. Further examples of deposition techniques (in-situ and ex-situ) and representative materials are disclosed in U.S. Provisional Application Nos. 61/573,873 and 61/629,098.

In lieu of preferentially oriented layered semiconductor films as discussed just above, preferentially oriented layered semiconductor substrates may also be fabricated and used. Fashioning a layered semiconductor into suitable substrate may be performed by first choosing a suitable layered semiconductor for the desired application. In a preferred embodiment, the material is crystalline in morphology/structure with the size of individual crystallites making up the crystalline material being from a few nanometers to tens of microns to tens of millimeters. As a second step, the chosen layered semiconductor is preferentially orientated. As example of a process for preferentially orientating the layered semiconductor may follow a process similar to that of making mica paper. Mica paper is typically made by mixing crushed mica particles in a liquid medium. This slurry is then laid out on a sieve and the water drained out. Interestingly, the deposited mica particles tend to be uniaxially aligned, that is, the particles preferentially orient themselves and lay down such that basal planes of the particles are mostly parallel to the paper surface. These sheets of oriented particles may then be built up into thicker substrates by laying multiple such sheets on top of each other, with or without binder material in between each sheet, and then pressed together under heat and/or pressure to form a laminate structure.

The example immediately above focused on stacking the same layered semiconductor on top of itself to build a lamellar semiconductor. As an alternative formulation, multiple sheets of layered semiconductors of two differing compositions may be stacked on top of each other, sequentially (alternatingly), and then pressed together under heat and/or pressure to form a laminate structure (with or without binder material in between each sheet). In yet another alternative, multiple sheets of layered semiconductors of a singular composition but differing phase may be stacked on top of each other, sequentially (alternatingly), and then pressed together under heat and/or pressure to form a laminate structure (with or without binder material in between each sheet). For example: sheets of hexagonal phase can be interspaced with sheets of cubic phase and then pressed into a laminate structure.

In yet another alternative, multiple sheets of layered semiconductors of a singular composition, but differing physical orientation of the flakes, may be stacked on top of each other, sequentially (alternatingly), and then pressed together under heat and/or pressure to form a laminate structure (with or without binder material in-between each sheet). For example, in one sheet, the flakes of the layered semiconductor are preferentially oriented such that the basal planes of the flakes are mostly parallel to the sheet surface. Whereas, in another sheet, the flakes of the layered semiconductor are preferentially oriented such that the basal planes of the flakes are mostly perpendicular to the sheet surface.

The binder material, if included, may be organic or inorganic, may be a conductor/insulator/or a semiconductor material, as described elsewhere herein. There are fundamentally no limits on the thickness of the binder material layers. They may be as thin as a few angstroms to several hundreds of microns thick.

Another ex-situ method for preferentially orientating the components of layered semiconductors is to apply appropriate pressure and temperature. For example Boron nitride (layered material but not a semiconductor) particles/platelets can be consolidated into solid substrates by pressing and sintering. Techniques such as Hot Isostatic Pressing (HIP), Electroconsolidation (EC), Repeated Omnidirectional Compaction (ROC), and Ceracon are more commonly used. The resulting consolidated solid substrate may be thought of as being composed of artifical lamellaes as described above.

As can be appreciated, the choice of using either ex-situ or in-situ oriented layered semiconductor substrate is dependent on the user and the usage of the substrate for a particular application. Moreover, and for in-situ substrate fabrication methods, there exist techniques to weaken the artificial layers of such deposited coatings by, for example, selectively including dopants at various times during the coating deposition. This dopant inclusion serves to not only weaken the lamellae but also demark the lamellae along the thickness as the coating grows.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A phosphor for use with an optoelectronic device, said phosphor comprising: one or more lamellae separated from a bulk material, said bulk material being a lamellar semiconductor having at least one van der Waals cleavage plane and being configured to be cleavable along said at least one van der Waals cleavage plane into a plurality of said one or more lamellae, and wherein said one or more lamellae are tuned to the optoelectronic device so as to provide a photoluminescence output.

2. A phosphor according to claim 1, wherein said lamellar semiconductor is GaSe.

3. A phosphor according to claim 1, wherein said lamellar semiconductor includes a cleavage fracture plane at a desired thickness, said desired thickness corresponding to the thickness of one of said lamellar semiconductor lamellae.

4. A phosphor according to claim 1, wherein each of said one or more lamellae is less than about 100 nm in thickness.

5. A phosphor according to claim 1, wherein between each pair of said one or more lamellae is a separator layer.

6. A phosphor according to claim 5, wherein said separator layer comprises a semiconductor separator layer.

7. A phosphor according to claim 5, wherein said separator layer comprises an insulator separator layer.

8. A phosphor according to claim 1, wherein said bulk material includes an intercalated guest species between at least one pair of said one or more lamellae.

9. A phosphor according to claim 8, wherein said intercalated guest species is a rare earth metal for providing photoluminescence.

10. A phosphor according to claim 1, wherein said one or more lamellae has a non-uniform thickness such that the conversion of an input wavelength by the phosphor results in a multiple differing output wavelengths.

11. A phosphor according to claim 1, wherein the photoluminescence output of said one or more lamellae is based upon an input from the optoelectronic device.

12. A phosphor according to claim 11, wherein the optoelectronic device is a light emitting diode.

13. A phosphor according to claim 11, wherein the optoelectronic device is a laser diode.

14. A phosphor according to claim 11, wherein the optoelectronic device is a vertical cavity surface emitting laser.

15. A phosphor according to claim 11, wherein the optoelectronic device is a vertical external cavity surface emitting laser.

16. A phosphor according to claim 1, wherein the optoelectronic device is a photovoltaic cell.

17. A phosphor according to claim 1, wherein the photoluminescence output of said one or more lamellae has a center wavelength of emission of about 600 nm to about 620 nm and a bandwidth of about 30 nm.

18. A phosphor according to claim 1, wherein the photoluminescence output of said one or more lamellae has a center wavelength of emission of about 610 nm to about 615 nm and a bandwidth of about 30 nm to about 40 nm.

19. A phosphor according to claim 1, wherein the photoluminescence output is in the visible part of the electromagnetic spectrum.

20. A phosphor according to claim 19, wherein the photoluminescence output has a center wavelength of emission of about 600 nm to about 625 nm and a bandwidth of about 30nm to about 40 nm.

21. A phosphor according to claim 1, wherein the photoluminescence output is in the ultraviolet part of the electromagnetic spectrum.

22. A phosphor according to claim 1, wherein the photoluminescence output is in the near infrared part of the electromagnetic spectrum.

23. A method of producing a phosphor for modifying an electromagnetic input, the method comprising:
providing a bulk lamellar semiconductor having at least one van der Waals cleavage plane and a first surface;
bonding a permanent substrate to the first surface of the bulk lamellar semiconductor;
inducing a cleavage in the bulk lamellar semiconductor so as to generate a first cleaved semiconductor portion and a second cleaved semiconductor portion; and
detaching the permanent substrate and the first cleaved semiconductor portion from the second cleaved semiconductor portion, wherein the first cleaved semiconductor portion is a lamellae of the phosphor and wherein the lamellae is designed and configured to modify the electromagnetic input.

24. A method according to claim 23, wherein said providing a bulk lamellar semiconductor includes providing bulk lamellar GaSe.

25. A method according to claim 23, wherein said inducing a cleavage includes the steps of:
intercalating a guest species between the lamellae of the bulk lamellar semiconductor; and
providing an impulse to separate one or more of the lamellae of the bulk layered semiconductor.

26. A method according to claim 25, wherein said intercalating a guest species includes intercalating a rare earth metal for providing the photoluminescence.

27. A method according to claim 23, further including providing a separating layer on top of the first cleaved semiconductor portion.

28. A method according to claim 27, wherein said providing a separating layer includes depositing a semiconducting layer.

29. A method according to claim 27, wherein said providing a separating layer includes depositing an electrically insulating layer.

30. A method according to claim 23, further including modifying the first cleaved semiconducting portion so as to have a non-uniform thickness.

31. A method of fabricating a phosphor, comprising:
providing a lamellar semiconductor having at least one van der Waals cleavage plane and at least one detachable lamella;
separating the detachable lamella; and
including the detachable lamella with an optoelectronic device as an optical functional element of the optoelectronic device.

32. A method according to claim 31, wherein said providing the lamellar semiconductor includes providing an inherently lamellar material and said separating includes liberating at least one lamella from the inherently lamellar semiconductor.

33. A method according to claim 32, wherein said providing an inherently lamellar material includes providing a material comprising gallium and selenium.

34. A method according to claim 32, wherein said inherently lamellar material includes a lamellar material having a bulk band gap greater than or equal to 0.4 eV and less than or equal to 1.8 eV.

35. A method according to claim 32, wherein said inherently lamellar material includes a lamellar material having a bulk band gap greater than or equal to 1.8 eV and less than or equal to 2.5 eV.

36. A method according to claim 32, wherein said inherently lamellar material includes a lamellar material having a band gap greater than or equal to 2.5 eV and less than or equal to 4.5 eV.

37. A method according to claim 31, wherein said providing the lamellar semiconductor includes providing a lamellar semiconductor having at least one fabricated lamella.

38. A method according to claim 37, wherein said providing the lamellar semiconductor having at least one fabricated lamella includes providing a lamellar semiconductor having a deposited lamella deposited on a substrate, and said separating includes detaching the deposited lamella from the substrate.

39. A method according to claim 37, wherein said providing the lamellar semiconductor having at least one fabricated lamella includes providing a lamellar semiconductor having a plurality of fabricated lamellae defined by planes of weakness resulting from intercalation.

40. A method according to claim 37, wherein said providing the lamellar semiconductor having at least one fabricated lamella includes providing a lamellar semiconductor having a plurality of semiconductor-paper lamellae.

41. A method according to claim 31, wherein the detachable layer has a thickness and the method further comprises tuning the thickness of the detachable lamella as a function of desired characteristics of the phosphor.

42. A method according to claim 41, wherein said tuning the thickness is performed in conjunction with said separating.

43. A method according to claim 31, wherein said separating the detachable lamellae results in a quantum confinement lamella.

44. A method according to claim 31, wherein said providing the lamellar semiconductor includes providing a crystalline semiconductor having a plurality of lamellae, and said separating the detachable lamella from the lamellar semiconductor includes separating a subset of the plurality of lamellae from the crystalline semiconductor.

45. A method according to claim 44, wherein said separating the subset of the plurality of lamellae includes separating multiple lamellae from the crystalline semiconductor.

46. A method according to claim 31, further comprising sandwiching the detachable lamella between two semiconductor layers, wherein each of the two semiconductor layers has a band gap greater than the band gap of the detachable lamella.

47. A method according to claim 46, further comprising providing the detachable lamella with a thickness less than approximately 100 nm so that the detachable lamella functions as a quantum confinement lamella within the phosphor.

48. A method according to claim 46, further comprising providing the detachable lamella with a non-uniform thickness, thereby causing the optoelectronic device to emit a plurality of output wavelengths when subjected to an appropriate optical impulse.

49. A method according to claim 48, wherein said non-uniform thickness is curvilinear.

50. A method according to claim 48, wherein said non-uniform thickness is planar.

51. A method according to claim 31, further comprising modifying the band gap of the detachable lamella using an intercalant.

52. A method according to claim 31, further comprising modifying the band gap of the detachable lamella by exfoliation.

53. A method according to claim 31, wherein said separating is accomplished using an intercalant.

54. A method of fabricating an optoelectronic device including a phosphor as an optically functional element, the method comprising:
providing a lamellar semiconductor having at least one van der Waals cleavage plane and a crystalline semiconductor lamella, wherein the lamellar semiconductor is configured to allow the crystalline semiconductor lamella to be separated therefrom;
separating the crystalline semiconductor lamella from the lamellar semiconductor;
including the crystalline semiconductor lamella with the optoelectronic device as the phosphor; and
providing the optically functional element with a predetermined thickness based on the optical function of the optoelectrically functional element.

55. A method according to claim 54, wherein:
said providing the lamellar semiconductor includes depositing the crystalline semiconductor lamella onto a reusable crystalline substrate; and
said separating includes separating the crystalline semiconductor lamella from said crystalline substrate.

56. A method according to claim 54, wherein:
said providing the lamellar semiconductor includes providing a lamellar semiconductor comprising a plurality of crystalline semiconductor lamellae; and
said separating includes separating a subset of said plurality of crystalline semiconductor lamellae.

57. A method according to claim 54, wherein said providing the lamellar semiconductor includes fabricating the lamellar semiconductor to include a plurality of crystalline semiconductor lamellae.

58. A method according to claim 57, wherein said fabricating includes assembling a plurality of crystalline paper lamellae.

59. A method according to claim 57, wherein said fabricating includes intercalating a precursor to the lamellar semiconductor so as to create planes of weakness that define a plurality of crystalline semiconducting lamellae.

60. A method according to claim 54, wherein said providing the at least one optically functional element with a predetermined thickness is performed as part of said separating.

61. A method according to claim 54, wherein said providing the at least one optically functional element with a predetermined thickness includes, after said separating, adjusting the thickness of the crystalline semiconductor lamella.

62. A method according to claim 61, wherein said adjusting the thickness includes removing material from the crystalline semiconductor lamella.

63. A method according to claim 61, wherein said adjusting the thickness includes adding material on the crystalline semiconductor lamella.

64. A phosphor for use with an optoelectronic device, said phosphor comprising:
a layered substrate, wherein at least a portion of the layered substrate has been separated from a lamellar semiconductor having at least one van der Waals cleavage plane, the layered substrate including one or more of an insulator, a semiconductor, and a conductor;
a layer of wide band gap II-VI materials disposed on said layered substrate, wherein said layer of wide band gap II-VI materials is designed and configured as a function of the optoelectronic device to photoluminesce when subjected to an electromagnetic input.

65. A phosphor for use with an optoelectronic device, said phosphor comprising:
a layered substrate, wherein at least a portion of the layered substrate has been separated from a lamellar semiconductor having at least one van der Waals cleavage plane, the layered substrate including one or more of an insulator, a semiconductor, and a conductor;
a barrier layer disposed on said layered substrate; and
a quantum confining layer disposed on said barrier layer, wherein said layered substrate, barrier layer, and quantum confining layer are designed and configured as a function of the optoelectronic device to photoluminesce when subjected to an electromagnetic input.

66. A phosphor for use with an optoelectronic device, said phosphor comprising:
a permanent substrate; and
a lamellar layer separated from a lamellar semiconductor having at least one van der Waals cleavage plane, the lamellar layer including one or more of an insulator, a semiconductor, and a conductor disposed on said permanent substrate, wherein said lamellar layer is intercalated with one or more rare earth elements and wherein said lamellar layer and said one or more rare earth elements is tuned relative to the optoelectronic device so as to photoluminesce when subjected to an electromagnetic input.

* * * * *